US008853549B2

(12) United States Patent
Kato et al.

(10) Patent No.: US 8,853,549 B2
(45) Date of Patent: Oct. 7, 2014

(54) CIRCUIT SUBSTRATE AND METHOD OF MANUFACTURING SAME

(71) Applicant: Murata Manufacturing Co., Ltd., Nagaokakyo (JP)

(72) Inventors: Noboru Kato, Nagaokakyo (JP); Masahiro Ozawa, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 13/973,136

(22) Filed: Aug. 22, 2013

(65) Prior Publication Data

US 2013/0333926 A1    Dec. 19, 2013

Related U.S. Application Data

(63) Continuation of application No. 13/430,736, filed on Mar. 27, 2012, which is a continuation of application No. PCT/JP2010/066788, filed on Sep. 28, 2010.

(30) Foreign Application Priority Data

Sep. 30, 2009   (JP) ................. 2009-227556

(51) Int. Cl.
*H05K 1/02*       (2006.01)
*H05K 3/44*       (2006.01)
*H05K 3/46*       (2006.01)
*H05K 3/28*       (2006.01)

(52) U.S. Cl.
CPC .............. *H05K 1/028* (2013.01); *H05K 3/44* (2013.01); *H05K 3/281* (2013.01); *H05K 3/4691* (2013.01); *H05K 1/0281* (2013.01); *H05K 3/4614* (2013.01); *H05K 3/4632* (2013.01)
USPC ...................... 174/254; 156/308.2

(58) Field of Classification Search
CPC .......... H05K 1/02; H05K 3/44; H05K 3/4688; H05K 1/0393; H05K 1/118; H05K 1/028; H05K 3/28; H05K 3/281
USPC ........................ 174/254; 156/208.2
See application file for complete search history.

(56) References Cited

U.S. PATENT DOCUMENTS 3,364,564 A    1/1968  Kurtz et al.
4,794,397 A   12/1988  Ohe et al.
(Continued)

FOREIGN PATENT DOCUMENTS

CA         2 279 176 A1    7/1998
DE    10 2006 057 369 A1   6/2008
(Continued)

OTHER PUBLICATIONS

Official Communication issued in International Patent Application No. PCT/JP2011/068110, mailed on Sep. 20, 2011.

(Continued)

*Primary Examiner* — Timothy Thompson
*Assistant Examiner* — Charles Pizzuto
(74) *Attorney, Agent, or Firm* — Keating & Bennett, LLP

(57) ABSTRACT

A circuit substrate capable of reducing and preventing deviations of circuit characteristics includes a relatively hard region and a relatively soft region. A main body of the circuit substrate includes a stack of a plurality of flexible sheets made of a flexible material and includes rigid regions and a flexible region, the flexible region being more easily deformable than the rigid regions. Wiring conductors are disposed in the main body and define circuitry. Reinforcing insulative films are disposed so as to cover the portions where the wiring conductors are not disposed in the rigid regions on the flexible sheets when seen in plan view from the z-axis direction.

7 Claims, 6 Drawing Sheets

(56) References Cited

U.S. PATENT DOCUMENTS

| | | |
|---|---|---|
| 5,232,765 A | 8/1993 | Yano et al. |
| 5,253,969 A | 10/1993 | Richert |
| 5,337,063 A | 8/1994 | Takahira |
| 5,374,937 A | 12/1994 | Tsunekawa et al. |
| 5,399,060 A | 3/1995 | Richert |
| 5,491,483 A | 2/1996 | D'Hont |
| 5,528,222 A | 6/1996 | Moskowitz et al. |
| 5,757,074 A | 5/1998 | Matloubian et al. |
| 5,854,480 A | 12/1998 | Noto |
| 5,903,239 A | 5/1999 | Takahashi et al. |
| 5,936,150 A | 8/1999 | Kobrin et al. |
| 5,955,723 A | 9/1999 | Reiner |
| 5,995,006 A | 11/1999 | Walsh |
| 6,104,311 A | 8/2000 | Lastinger |
| 6,107,920 A | 8/2000 | Eberhardt et al. |
| 6,172,608 B1 | 1/2001 | Cole |
| 6,181,287 B1 | 1/2001 | Beigel |
| 6,190,942 B1 | 2/2001 | Wilm et al. |
| 6,243,045 B1 | 6/2001 | Ishibashi |
| 6,249,258 B1 | 6/2001 | Bloch et al. |
| 6,259,369 B1 | 7/2001 | Monico |
| 6,271,803 B1 | 8/2001 | Watanabe et al. |
| 6,335,686 B1 | 1/2002 | Goff et al. |
| 6,362,784 B1 | 3/2002 | Kane et al. |
| 6,367,143 B1 | 4/2002 | Sugimura |
| 6,378,774 B1 | 4/2002 | Emori et al. |
| 6,406,990 B1 | 6/2002 | Kawai |
| 6,448,874 B1 | 9/2002 | Shiino et al. |
| 6,452,563 B1 | 9/2002 | Porte |
| 6,462,716 B1 | 10/2002 | Kushihi |
| 6,542,050 B1 | 4/2003 | Arai et al. |
| 6,600,459 B2 | 7/2003 | Yokoshima et al. |
| 6,634,564 B2 | 10/2003 | Kuramochi |
| 6,664,645 B2 | 12/2003 | Kawai |
| 6,763,254 B2 | 7/2004 | Nishikawa |
| 6,812,707 B2 | 11/2004 | Yonezawa et al. |
| 6,828,881 B2 | 12/2004 | Mizutani et al. |
| 6,837,438 B1 | 1/2005 | Takasugi et al. |
| 6,861,731 B2 | 3/2005 | Buijsman et al. |
| 6,927,738 B2 | 8/2005 | Senba et al. |
| 6,956,481 B1 | 10/2005 | Cole |
| 6,963,729 B2 | 11/2005 | Uozumi |
| 7,088,249 B2 | 8/2006 | Senba et al. |
| 7,088,307 B2 | 8/2006 | Imaizumi |
| 7,112,952 B2 | 9/2006 | Arai et al. |
| 7,119,693 B1 | 10/2006 | Devilbiss |
| 7,129,834 B2 | 10/2006 | Naruse et al. |
| 7,248,221 B2 | 7/2007 | Kai et al. |
| 7,250,910 B2 | 7/2007 | Yoshikawa et al. |
| 7,276,929 B2 | 10/2007 | Arai et al. |
| 7,317,396 B2 | 1/2008 | Ujino |
| 7,405,664 B2 | 7/2008 | Sakama et al. |
| 7,903,915 B2 * | 3/2011 | Meyyappan et al. ......... 385/100 |
| 8,168,893 B2 * | 5/2012 | Ito et al. ...................... 174/260 |
| 8,383,948 B2 * | 2/2013 | Aoyama et al. ............. 174/254 |
| 8,405,999 B2 * | 3/2013 | Takahashi .................... 361/749 |
| 2001/0011012 A1 | 8/2001 | Hino et al. |
| 2002/0011967 A1 | 1/2002 | Goff et al. |
| 2002/0015002 A1 | 2/2002 | Yasukawa et al. |
| 2002/0044092 A1 | 4/2002 | Kushihi |
| 2002/0067316 A1 | 6/2002 | Yokoshima et al. |
| 2002/0093457 A1 | 7/2002 | Hamada et al. |
| 2002/0186004 A1 | 12/2002 | Prazeres da Costa et al. |
| 2003/0006901 A1 | 1/2003 | Kim et al. |
| 2003/0020661 A1 | 1/2003 | Sato |
| 2003/0045324 A1 | 3/2003 | Nagumo et al. |
| 2003/0169153 A1 | 9/2003 | Muller |
| 2003/0206095 A1 | 11/2003 | Chaloner et al. |
| 2004/0001027 A1 | 1/2004 | Killen et al. |
| 2004/0026519 A1 | 2/2004 | Usami et al. |
| 2004/0056823 A1 | 3/2004 | Zuk et al. |
| 2004/0066617 A1 | 4/2004 | Hirabayashi et al. |
| 2004/0217915 A1 | 11/2004 | Imaizumi |
| 2004/0219956 A1 | 11/2004 | Iwai et al. |
| 2004/0227673 A1 | 11/2004 | Iwai et al. |
| 2004/0252064 A1 | 12/2004 | Yuanzhu |
| 2005/0001031 A1 | 1/2005 | Akiho et al. |
| 2005/0007296 A1 | 1/2005 | Endo et al. |
| 2005/0092836 A1 | 5/2005 | Kudo |
| 2005/0099337 A1 | 5/2005 | Takei et al. |
| 2005/0125093 A1 | 6/2005 | Kikuchi et al. |
| 2005/0133605 A1 | 6/2005 | Koyama et al. |
| 2005/0134460 A1 | 6/2005 | Usami |
| 2005/0134506 A1 | 6/2005 | Egbert |
| 2005/0138798 A1 | 6/2005 | Sakama et al. |
| 2005/0140512 A1 | 6/2005 | Sakama et al. |
| 2005/0162331 A1 | 7/2005 | Endo et al. |
| 2005/0232412 A1 | 10/2005 | Ichihara et al. |
| 2005/0236623 A1 | 10/2005 | Takechi et al. |
| 2005/0253726 A1 | 11/2005 | Yoshida et al. |
| 2005/0275539 A1 | 12/2005 | Sakama et al. |
| 2006/0001138 A1 | 1/2006 | Sakama et al. |
| 2006/0032926 A1 | 2/2006 | Baba et al. |
| 2006/0044192 A1 | 3/2006 | Egbert |
| 2006/0055531 A1 | 3/2006 | Cook et al. |
| 2006/0055601 A1 | 3/2006 | Kameda et al. |
| 2006/0071084 A1 | 4/2006 | Detig et al. |
| 2006/0109185 A1 | 5/2006 | Iwai et al. |
| 2006/0114159 A1 | 6/2006 | Yoshikawa et al. |
| 2006/0145872 A1 | 7/2006 | Tanaka et al. |
| 2006/0158380 A1 | 7/2006 | Son et al. |
| 2006/0170606 A1 | 8/2006 | Yamagajo et al. |
| 2006/0208900 A1 | 9/2006 | Tavassoli Hozouri |
| 2006/0214801 A1 | 9/2006 | Murofushi et al. |
| 2006/0220871 A1 | 10/2006 | Baba et al. |
| 2006/0244568 A1 | 11/2006 | Tong et al. |
| 2006/0244676 A1 | 11/2006 | Uesaka |
| 2006/0267138 A1 | 11/2006 | Kobayashi |
| 2007/0004028 A1 | 1/2007 | Lair et al. |
| 2007/0015549 A1 | 1/2007 | Hernandez et al. |
| 2007/0018893 A1 | 1/2007 | Kai et al. |
| 2007/0040028 A1 | 2/2007 | Kawamata |
| 2007/0052613 A1 | 3/2007 | Gallschuetz et al. |
| 2007/0057854 A1 | 3/2007 | Oodachi et al. |
| 2007/0069037 A1 | 3/2007 | Kawai |
| 2007/0132591 A1 | 6/2007 | Khatri |
| 2007/0164414 A1 | 7/2007 | Dokai et al. |
| 2007/0200705 A1 | 8/2007 | Yamagajo et al. |
| 2007/0200782 A1 | 8/2007 | Hayama et al. |
| 2007/0229276 A1 | 10/2007 | Yamagajo et al. |
| 2007/0247387 A1 | 10/2007 | Kubo et al. |
| 2007/0252700 A1 | 11/2007 | Ishihara et al. |
| 2007/0252703 A1 | 11/2007 | Kato et al. |
| 2007/0252763 A1 | 11/2007 | Martin |
| 2007/0252770 A1 | 11/2007 | Kai et al. |
| 2007/0285335 A1 | 12/2007 | Bungo et al. |
| 2007/0290928 A1 | 12/2007 | Chang et al. |
| 2008/0024156 A1 | 1/2008 | Arai et al. |
| 2008/0068132 A1 | 3/2008 | Kayanakis et al. |
| 2008/0070003 A1 | 3/2008 | Nakatani et al. |
| 2008/0074268 A1 | 3/2008 | Shafer |
| 2008/0087990 A1 | 4/2008 | Kato et al. |
| 2008/0111695 A1 | 5/2008 | Yamagajo et al. |
| 2008/0129606 A1 | 6/2008 | Yanagisawa et al. |
| 2008/0143630 A1 | 6/2008 | Kato et al. |
| 2008/0169905 A1 | 7/2008 | Slatter |
| 2008/0184281 A1 | 7/2008 | Ashizaki et al. |
| 2008/0252551 A1 | 10/2008 | Kubo et al. |
| 2008/0272885 A1 | 11/2008 | Atherton |
| 2009/0002130 A1 | 1/2009 | Kato |
| 2009/0008460 A1 | 1/2009 | Kato |
| 2009/0009007 A1 | 1/2009 | Kato et al. |
| 2009/0021352 A1 | 1/2009 | Kataya et al. |
| 2009/0021446 A1 | 1/2009 | Kataya et al. |
| 2009/0065594 A1 | 3/2009 | Kato et al. |
| 2009/0066466 A1 | 3/2009 | Arimura |
| 2009/0080296 A1 | 3/2009 | Dokai et al. |
| 2009/0096696 A1 | 4/2009 | Joyce, Jr. et al. |
| 2009/0109034 A1 | 4/2009 | Chen et al. |
| 2009/0109102 A1 | 4/2009 | Dokai et al. |
| 2009/0134979 A1 | 5/2009 | Tsukamoto et al. |
| 2009/0140947 A1 | 6/2009 | Sasagawa et al. |
| 2009/0160719 A1 | 6/2009 | Kato et al. |
| 2009/0188703 A1 | 7/2009 | Ito et al. |

(56) References Cited

U.S. PATENT DOCUMENTS

| | | |
|---|---|---|
| 2009/0201116 A1 | 8/2009 | Orihara |
| 2009/0224061 A1 | 9/2009 | Kato et al. |
| 2009/0229876 A1 | 9/2009 | Takahashi |
| 2009/0231106 A1 | 9/2009 | Okamura |
| 2009/0262041 A1 | 10/2009 | Ikemoto et al. |
| 2009/0266900 A1 | 10/2009 | Ikemoto et al. |
| 2009/0278687 A1 | 11/2009 | Kato |
| 2009/0284220 A1 | 11/2009 | Toncich et al. |
| 2009/0321527 A1 | 12/2009 | Kato et al. |
| 2010/0103058 A1 | 4/2010 | Kato et al. |
| 2010/0126760 A1 | 5/2010 | Ishikawa |
| 2010/0182210 A1 | 7/2010 | Ryou et al. |
| 2010/0283694 A1 | 11/2010 | Kato |
| 2010/0308118 A1 | 12/2010 | Kataya et al. |
| 2011/0031320 A1 | 2/2011 | Kato et al. |
| 2011/0063184 A1 | 3/2011 | Furumura et al. |
| 2011/0080331 A1 | 4/2011 | Kato |
| 2011/0186641 A1 | 8/2011 | Kato et al. |
| 2011/0253795 A1 | 10/2011 | Kato |
| 2012/0001701 A1 | 1/2012 | Taniguchi et al. |

FOREIGN PATENT DOCUMENTS

| | | |
|---|---|---|
| EP | 0 694 874 A2 | 1/1996 |
| EP | 0 848 448 A2 | 6/1998 |
| EP | 0 948 083 A2 | 10/1999 |
| EP | 0 977 145 A2 | 2/2000 |
| EP | 1 010 543 A1 | 6/2000 |
| EP | 1 085 480 A1 | 3/2001 |
| EP | 1 160 915 A2 | 12/2001 |
| EP | 1 170 795 A2 | 1/2002 |
| EP | 1 193 793 A2 | 4/2002 |
| EP | 1 227 540 A1 | 7/2002 |
| EP | 1 280 232 A1 | 1/2003 |
| EP | 1 280 350 A1 | 1/2003 |
| EP | 1 343 223 A1 | 9/2003 |
| EP | 1 357 511 A2 | 10/2003 |
| EP | 1 547 753 A1 | 6/2005 |
| EP | 1 548 872 A1 | 6/2005 |
| EP | 1 626 364 A2 | 2/2006 |
| EP | 1 701 296 A1 | 9/2006 |
| EP | 1 703 589 A1 | 9/2006 |
| EP | 1 742 296 A1 | 1/2007 |
| EP | 1 744 398 A1 | 1/2007 |
| EP | 1 840 802 A1 | 10/2007 |
| EP | 1 841 005 A1 | 10/2007 |
| EP | 1 865 574 A1 | 12/2007 |
| EP | 1 887 652 A1 | 2/2008 |
| EP | 1 976 056 A1 | 10/2008 |
| EP | 1 988 491 A1 | 11/2008 |
| EP | 1 988 601 A1 | 11/2008 |
| EP | 1 993 170 A1 | 11/2008 |
| EP | 2 009 738 A1 | 12/2008 |
| EP | 2 012 258 A1 | 1/2009 |
| EP | 2 096 709 A1 | 9/2009 |
| EP | 2 148 449 A1 | 1/2010 |
| EP | 2 166 617 A1 | 3/2010 |
| EP | 2 251 934 A1 | 11/2010 |
| EP | 2 256 861 A1 | 12/2010 |
| EP | 2 330 684 A1 | 6/2011 |
| GB | 2 305 075 A | 3/1997 |
| GB | 2461443 A | 1/2010 |
| GB | 2470299 A | 11/2010 |
| JP | 50-143451 | 11/1975 |
| JP | 61-284102 A | 12/1986 |
| JP | 62-127140 U | 8/1987 |
| JP | 01-212035 A | 8/1989 |
| JP | 02-164105 A | 6/1990 |
| JP | 02-256208 A | 10/1990 |
| JP | 3-171385 A | 7/1991 |
| JP | 03-503467 A | 8/1991 |
| JP | 03-262313 A | 11/1991 |
| JP | 04-150011 A | 5/1992 |
| JP | 04-167500 A | 6/1992 |
| JP | 04-096814 U | 8/1992 |
| JP | 04-101168 U | 9/1992 |
| JP | 04-134807 U | 12/1992 |
| JP | 05-226926 A | 9/1993 |
| JP | 05-327331 A | 12/1993 |
| JP | 6-53733 A | 2/1994 |
| JP | 06-077729 A | 3/1994 |
| JP | 06-029215 U | 4/1994 |
| JP | 06-177635 A | 6/1994 |
| JP | 6-260949 A | 9/1994 |
| JP | 06-326424 A | 11/1994 |
| JP | 6326424 A * | 11/1994 |
| JP | 07-183836 A | 7/1995 |
| JP | 08-055725 A | 2/1996 |
| JP | 08-056113 A | 2/1996 |
| JP | 8-87580 A | 4/1996 |
| JP | 08-088586 A | 4/1996 |
| JP | 08-88586 A | 4/1996 |
| JP | 08-176421 A | 7/1996 |
| JP | 08-180160 A | 7/1996 |
| JP | 08-279027 A | 10/1996 |
| JP | 08-307126 A | 11/1996 |
| JP | 08-330372 A | 12/1996 |
| JP | 09-014150 A | 1/1997 |
| JP | 09-035025 A | 2/1997 |
| JP | 9-93029 A | 4/1997 |
| JP | 09-093029 A | 4/1997 |
| JP | 09-245381 A | 9/1997 |
| JP | 09-252217 A | 9/1997 |
| JP | 09-270623 A | 10/1997 |
| JP | 09-284038 A | 10/1997 |
| JP | 09-294374 A | 11/1997 |
| JP | 9-512367 A | 12/1997 |
| JP | 10-69533 A | 3/1998 |
| JP | 10-069533 A | 3/1998 |
| JP | 10-084406 A | 3/1998 |
| JP | 10-505466 A | 5/1998 |
| JP | 10-171954 A | 6/1998 |
| JP | 10-173427 A | 6/1998 |
| JP | 10-193849 A | 7/1998 |
| JP | 10-193851 A | 7/1998 |
| JP | 10-242742 A | 9/1998 |
| JP | 10-293828 A | 11/1998 |
| JP | 10-334203 A | 12/1998 |
| JP | 11-025244 A | 1/1999 |
| JP | 11-039441 A | 2/1999 |
| JP | 11-075329 A | 3/1999 |
| JP | 11-085937 A | 3/1999 |
| JP | 11-88241 A | 3/1999 |
| JP | 11-102424 A | 4/1999 |
| JP | 11-103209 A | 4/1999 |
| JP | 11-149536 A | 6/1999 |
| JP | 11-149537 A | 6/1999 |
| JP | 11-149538 A | 6/1999 |
| JP | 11-175678 A | 7/1999 |
| JP | 11-219420 A | 8/1999 |
| JP | 11-220319 A | 8/1999 |
| JP | 11-282993 A | 10/1999 |
| JP | 11-328352 A | 11/1999 |
| JP | 11-331014 A | 11/1999 |
| JP | 11-346114 A | 12/1999 |
| JP | 11-515094 A | 12/1999 |
| JP | 2000-21128 A | 1/2000 |
| JP | 2000-021639 A | 1/2000 |
| JP | 2000-022421 A | 1/2000 |
| JP | 2000-048152 A | 2/2000 |
| JP | 2000-059260 A | 2/2000 |
| JP | 2000-085283 A | 3/2000 |
| JP | 2000-090207 A | 3/2000 |
| JP | 2000-132643 A | 5/2000 |
| JP | 2000-137778 A | 5/2000 |
| JP | 2000-137779 A | 5/2000 |
| JP | 2000-137785 A | 5/2000 |
| JP | 2000-148948 A | 5/2000 |
| JP | 2000-172812 A | 6/2000 |
| JP | 2000-209013 A | 7/2000 |
| JP | 2000-222540 A | 8/2000 |
| JP | 2000-510271 A | 8/2000 |
| JP | 2000-242754 A | 9/2000 |

(56) References Cited

FOREIGN PATENT DOCUMENTS

| | | |
|---|---|---|
| JP | 2000-243797 A | 9/2000 |
| JP | 2000-251049 A | 9/2000 |
| JP | 2000-261230 A | 9/2000 |
| JP | 2000-276569 A | 10/2000 |
| JP | 2000-286634 A | 10/2000 |
| JP | 2000-286760 A | 10/2000 |
| JP | 2000-311226 A | 11/2000 |
| JP | 2000-321984 A | 11/2000 |
| JP | 2000-349680 A | 12/2000 |
| JP | 2001-10264 A | 1/2001 |
| JP | 2001-028036 A | 1/2001 |
| JP | 2001-043340 A | 2/2001 |
| JP | 3075400 U | 2/2001 |
| JP | 2001-66990 A | 3/2001 |
| JP | 2001-76111 A | 3/2001 |
| JP | 2001-084463 A | 3/2001 |
| JP | 2001-101369 A | 4/2001 |
| JP | 2001-505682 A | 4/2001 |
| JP | 2001-168628 A | 6/2001 |
| JP | 2001-188890 A | 7/2001 |
| JP | 2001-209767 A | 8/2001 |
| JP | 2001-240046 A | 9/2001 |
| JP | 2001-240217 A | 9/2001 |
| JP | 2001-256457 A | 9/2001 |
| JP | 2001-257292 A | 9/2001 |
| JP | 2001-514777 A | 9/2001 |
| JP | 2001-291181 A | 10/2001 |
| JP | 2001-319380 A | 11/2001 |
| JP | 2001-331976 A | 11/2001 |
| JP | 2001-332923 A | 11/2001 |
| JP | 2001-339226 A | 12/2001 |
| JP | 2001-344574 A | 12/2001 |
| JP | 2001-351083 A | 12/2001 |
| JP | 2001-351084 A | 12/2001 |
| JP | 2001-352176 A | 12/2001 |
| JP | 2001-358527 A | 12/2001 |
| JP | 2002-024776 A | 1/2002 |
| JP | 2002-026513 A | 1/2002 |
| JP | 2002-32731 A | 1/2002 |
| JP | 2002-042076 A | 2/2002 |
| JP | 2002-042083 A | 2/2002 |
| JP | 2002-063557 A | 2/2002 |
| JP | 2002-505645 A | 2/2002 |
| JP | 2002-76750 A | 3/2002 |
| JP | 2002-076750 A | 3/2002 |
| JP | 2002-111363 A | 4/2002 |
| JP | 2002-143826 A | 5/2002 |
| JP | 2002-150245 A | 5/2002 |
| JP | 2002-157564 A | 5/2002 |
| JP | 2002-158529 A | 5/2002 |
| JP | 2002-175508 A | 6/2002 |
| JP | 2002-175920 A | 6/2002 |
| JP | 2002-183676 A | 6/2002 |
| JP | 2002-183690 A | 6/2002 |
| JP | 2002-185358 A | 6/2002 |
| JP | 2002-204117 A | 7/2002 |
| JP | 2002-521757 A | 7/2002 |
| JP | 2002-522849 A | 7/2002 |
| JP | 2002-222398 A | 8/2002 |
| JP | 2002-230128 A | 8/2002 |
| JP | 2002-232221 A | 8/2002 |
| JP | 2002-245416 A | 8/2002 |
| JP | 2002-246828 A | 8/2002 |
| JP | 2002-252117 A | 9/2002 |
| JP | 2002-259934 A | 9/2002 |
| JP | 2002-280821 A | 9/2002 |
| JP | 2002-290130 A | 10/2002 |
| JP | 2002-298109 A | 10/2002 |
| JP | 2002-308437 A | 10/2002 |
| JP | 2002-319008 A | 10/2002 |
| JP | 2002-319009 A | 10/2002 |
| JP | 2002-319812 A | 10/2002 |
| JP | 2002-324221 A | 11/2002 |
| JP | 2002-325013 A | 11/2002 |
| JP | 2002-362613 A | 12/2002 |
| JP | 2002-366917 A | 12/2002 |
| JP | 2002-373029 A | 12/2002 |
| JP | 2002-373323 A | 12/2002 |
| JP | 2002-374139 A | 12/2002 |
| JP | 2003-006599 A | 1/2003 |
| JP | 2003-016412 A | 1/2003 |
| JP | 2003-022912 A | 1/2003 |
| JP | 2003-026177 A | 1/2003 |
| JP | 2003-030612 A | 1/2003 |
| JP | 2003-037861 A | 2/2003 |
| JP | 2003-44789 A | 2/2003 |
| JP | 2003-046318 A | 2/2003 |
| JP | 2003-58840 A | 2/2003 |
| JP | 2003-067711 A | 3/2003 |
| JP | 2003-069335 A | 3/2003 |
| JP | 2003-076947 A | 3/2003 |
| JP | 2003-76963 A | 3/2003 |
| JP | 2003-78333 A | 3/2003 |
| JP | 2003-078336 A | 3/2003 |
| JP | 2003-085501 A | 3/2003 |
| JP | 2003-085520 A | 3/2003 |
| JP | 2003-87008 A | 3/2003 |
| JP | 2003-87044 A | 3/2003 |
| JP | 2003-099184 A | 4/2003 |
| JP | 2003-099720 A | 4/2003 |
| JP | 2003-099721 A | 4/2003 |
| JP | 2003-108966 A | 4/2003 |
| JP | 2003-110344 A | 4/2003 |
| JP | 2003-132330 A | 5/2003 |
| JP | 2003-134007 A | 5/2003 |
| JP | 2003-139866 A | 5/2003 |
| JP | 2003-155062 A | 5/2003 |
| JP | 2003-158414 A | 5/2003 |
| JP | 2003-168760 A | 6/2003 |
| JP | 2003-179565 A | 6/2003 |
| JP | 2003-187207 A | 7/2003 |
| JP | 2003-187211 A | 7/2003 |
| JP | 2003-188338 A | 7/2003 |
| JP | 2003-188620 A | 7/2003 |
| JP | 2003-198230 A | 7/2003 |
| JP | 2003-209421 A | 7/2003 |
| JP | 2003-216919 A | 7/2003 |
| JP | 2003-218624 A | 7/2003 |
| JP | 2003-233780 A | 8/2003 |
| JP | 2003-242471 A | 8/2003 |
| JP | 2003-243918 A | 8/2003 |
| JP | 2003-249813 A | 9/2003 |
| JP | 2003-529163 A | 9/2003 |
| JP | 2003-288560 A | 10/2003 |
| JP | 2003-308363 A | 10/2003 |
| JP | 2003-309418 A | 10/2003 |
| JP | 2003-317055 A | 11/2003 |
| JP | 2003-317060 A | 11/2003 |
| JP | 2003-331246 A | 11/2003 |
| JP | 2003-332820 A | 11/2003 |
| JP | 2003-536302 A | 12/2003 |
| JP | 2004-040597 A | 2/2004 |
| JP | 2004-505481 A | 2/2004 |
| JP | 2004-082775 A | 3/2004 |
| JP | 2004-88218 A | 3/2004 |
| JP | 2004-93693 A | 3/2004 |
| JP | 2004-096566 A | 3/2004 |
| JP | 2004-096618 A | 3/2004 |
| JP | 2004-506905 A | 3/2004 |
| JP | 2004-104344 A | 4/2004 |
| JP | 2004-121412 A | 4/2004 |
| JP | 2004-126750 A | 4/2004 |
| JP | 2004-127230 A | 4/2004 |
| JP | 2004-140513 A | 5/2004 |
| JP | 2004-145449 A | 5/2004 |
| JP | 2004-152964 A | 5/2004 |
| JP | 2004-163134 A | 6/2004 |
| JP | 2004-166175 A | 6/2004 |
| JP | 2004-166176 A | 6/2004 |
| JP | 2004-172919 A | 6/2004 |
| JP | 2004-213582 A | 7/2004 |
| JP | 2004-519916 A | 7/2004 |
| JP | 2004/070879 A | 8/2004 |
| JP | 2004-234595 A | 8/2004 |

(56) References Cited

FOREIGN PATENT DOCUMENTS

| | | |
|---|---|---|
| JP | 2004-253858 A | 9/2004 |
| JP | 2004-527864 A | 9/2004 |
| JP | 2004-280390 A | 10/2004 |
| JP | 2004-282403 A | 10/2004 |
| JP | 2004-287767 A | 10/2004 |
| JP | 2004-295297 A | 10/2004 |
| JP | 2004-297249 A | 10/2004 |
| JP | 2004-297681 A | 10/2004 |
| JP | 2004-304370 A | 10/2004 |
| JP | 2004-319848 A | 11/2004 |
| JP | 2004-326380 A | 11/2004 |
| JP | 2004-334268 A | 11/2004 |
| JP | 2004-336250 A | 11/2004 |
| JP | 2004-336604 A | 11/2004 |
| JP | 2004-343000 A | 12/2004 |
| JP | 2004-362190 A | 12/2004 |
| JP | 2004-362341 A | 12/2004 |
| JP | 2004-362602 A | 12/2004 |
| JP | 2005-5866 A | 1/2005 |
| JP | 2005-006096 A | 1/2005 |
| JP | 2005-18156 A | 1/2005 |
| JP | 2005-033461 A | 2/2005 |
| JP | 2005-050581 A | 2/2005 |
| JP | 2005-064799 A | 3/2005 |
| JP | 2005-124061 A | 5/2005 |
| JP | 2005-128592 A | 5/2005 |
| JP | 2005-129019 A | 5/2005 |
| JP | 2005-134942 A | 5/2005 |
| JP | 2005-135132 A | 5/2005 |
| JP | 2005-136528 A | 5/2005 |
| JP | 2005-137032 A | 5/2005 |
| JP | 3653099 B2 | 5/2005 |
| JP | 2005-165839 A | 6/2005 |
| JP | 2005-167327 A | 6/2005 |
| JP | 2005-167813 A | 6/2005 |
| JP | 2005-190417 A | 7/2005 |
| JP | 2005-191705 A | 7/2005 |
| JP | 2005-192124 A | 7/2005 |
| JP | 2005-202943 A | 7/2005 |
| JP | 2005-204038 A | 7/2005 |
| JP | 2005-210223 A | 8/2005 |
| JP | 2005-210676 A | 8/2005 |
| JP | 2005-210680 A | 8/2005 |
| JP | 2005-217822 A | 8/2005 |
| JP | 2005-229474 A | 8/2005 |
| JP | 2005-236339 A | 9/2005 |
| JP | 2005-244778 A | 9/2005 |
| JP | 2005-252853 A | 9/2005 |
| JP | 2005-275870 A | 10/2005 |
| JP | 2005-277579 A | 10/2005 |
| JP | 2005-284352 A | 10/2005 |
| JP | 2005-284455 A | 10/2005 |
| JP | 2005-293537 A | 10/2005 |
| JP | 2005-295135 A | 10/2005 |
| JP | 2005-306696 A | 11/2005 |
| JP | 2005-311205 A | 11/2005 |
| JP | 2005-321305 A | 11/2005 |
| JP | 2005-322119 A | 11/2005 |
| JP | 2005-327622 A | 11/2005 |
| JP | 2005-328259 A | 11/2005 |
| JP | 2005-333244 A | 12/2005 |
| JP | 2005-335755 A | 12/2005 |
| JP | 2005-340759 A | 12/2005 |
| JP | 2005-345802 A | 12/2005 |
| JP | 2005-346820 A | 12/2005 |
| JP | 2005-352858 A | 12/2005 |
| JP | 2006-013976 A | 1/2006 |
| JP | 2006-13976 A | 1/2006 |
| JP | 2006-025390 A | 1/2006 |
| JP | 2006-031766 A | 2/2006 |
| JP | 2006-033312 A | 2/2006 |
| JP | 2006-39902 A | 2/2006 |
| JP | 2006-039947 A | 2/2006 |
| JP | 2006-42059 A | 2/2006 |
| JP | 2006-42097 A | 2/2006 |
| JP | 2006-050200 A | 2/2006 |
| JP | 2006-053833 A | 2/2006 |
| JP | 2006-67479 A | 3/2006 |
| JP | 2006-72706 A | 3/2006 |
| JP | 2006-074348 A | 3/2006 |
| JP | 2006-80367 A | 3/2006 |
| JP | 2006-92630 A | 4/2006 |
| JP | 2006-102953 A | 4/2006 |
| JP | 2006-107296 A | 4/2006 |
| JP | 2006-513594 A | 4/2006 |
| JP | 2006-148462 A | 6/2006 |
| JP | 2006-148518 A | 6/2006 |
| JP | 2006-151402 A | 6/2006 |
| JP | 2006-174151 A | 6/2006 |
| JP | 2006-186178 A | 7/2006 |
| JP | 2006-195795 A | 7/2006 |
| JP | 2006-203187 A | 8/2006 |
| JP | 2006-203852 A | 8/2006 |
| JP | 2006-217000 A | 8/2006 |
| JP | 2006-232292 A | 9/2006 |
| JP | 2006-237674 A | 9/2006 |
| JP | 2006-238282 A | 9/2006 |
| JP | 2006-246372 A | 9/2006 |
| JP | 2006-270212 A | 10/2006 |
| JP | 2006-270681 A | 10/2006 |
| JP | 2006-270766 A | 10/2006 |
| JP | 2006-285911 A | 10/2006 |
| JP | 2006-287659 A | 10/2006 |
| JP | 2006-295879 A | 10/2006 |
| JP | 2006-302219 A | 11/2006 |
| JP | 2006-309401 A | 11/2006 |
| JP | 2006-311239 A | 11/2006 |
| JP | 2006-323481 A | 11/2006 |
| JP | 2006-339186 A | 12/2006 |
| JP | 2006-339964 A | 12/2006 |
| JP | 2007-007888 A | 1/2007 |
| JP | 2007-13120 A | 1/2007 |
| JP | 2007-013120 A | 1/2007 |
| JP | 2007-18067 A | 1/2007 |
| JP | 2007-019905 A | 1/2007 |
| JP | 2007-28002 A | 2/2007 |
| JP | 2007-028002 A | 2/2007 |
| JP | 2007-040702 A | 2/2007 |
| JP | 2007-043535 A | 2/2007 |
| JP | 2007-048126 A | 2/2007 |
| JP | 2007-65822 A | 3/2007 |
| JP | 2007-068073 A | 3/2007 |
| JP | 2007-79687 A | 3/2007 |
| JP | 2007-080858 A | 3/2007 |
| JP | 2007-80858 A | 3/2007 |
| JP | 2007-81712 A | 3/2007 |
| JP | 2007-096655 A | 4/2007 |
| JP | 2007-096768 A | 4/2007 |
| JP | 2007-102348 A | 4/2007 |
| JP | 2007-116347 A | 5/2007 |
| JP | 2007-122542 A | 5/2007 |
| JP | 2007-149757 A | 6/2007 |
| JP | 2007-150642 A | 6/2007 |
| JP | 2007-150868 A | 6/2007 |
| JP | 2007-159083 A | 6/2007 |
| JP | 2007-159129 A | 6/2007 |
| JP | 2007-166133 A | 6/2007 |
| JP | 3975918 B2 | 6/2007 |
| JP | 2007-172369 A | 7/2007 |
| JP | 2007-172527 A | 7/2007 |
| JP | 2007-194924 A | 8/2007 |
| JP | 2007-524942 A | 8/2007 |
| JP | 2007-228254 A | 9/2007 |
| JP | 2007-228325 A | 9/2007 |
| JP | 2007-228437 A | 9/2007 |
| JP | 2007-233597 A | 9/2007 |
| JP | 2007-241789 A | 9/2007 |
| JP | 2007-249620 A | 9/2007 |
| JP | 2007-266999 A | 10/2007 |
| JP | 2007-272264 A | 10/2007 |
| JP | 2007-279782 A | 10/2007 |
| JP | 2007-287128 A | 11/2007 |
| JP | 2007-295177 A | 11/2007 |
| JP | 2007-295395 A | 11/2007 |

(56) References Cited

FOREIGN PATENT DOCUMENTS

| | | |
|---|---|---|
| JP | 2007-295557 A | 11/2007 |
| JP | 2007-305716 A | 11/2007 |
| JP | 2007-312350 A | 11/2007 |
| JP | 2007-324865 A | 12/2007 |
| JP | 2008-033716 A | 2/2008 |
| JP | 2008-042910 A | 2/2008 |
| JP | 2008-72243 A | 3/2008 |
| JP | 2008-083867 A | 4/2008 |
| JP | 2008-092131 A | 4/2008 |
| JP | 2008-097426 A | 4/2008 |
| JP | 2008-098993 A | 4/2008 |
| JP | 4069958 B2 | 4/2008 |
| JP | 2008-103691 A | 5/2008 |
| JP | 2008-107947 A | 5/2008 |
| JP | 2008-118359 A | 5/2008 |
| JP | 2008-513888 A | 5/2008 |
| JP | 2008-148345 A | 6/2008 |
| JP | 2008-519347 A | 6/2008 |
| JP | 2008-160821 A | 7/2008 |
| JP | 2008-160874 A | 7/2008 |
| JP | 2008-167190 A | 7/2008 |
| JP | 2008-182438 A | 8/2008 |
| JP | 2008-197714 A | 8/2008 |
| JP | 2008-535372 A | 8/2008 |
| JP | 2008-207875 A | 9/2008 |
| JP | 2008-211572 A | 9/2008 |
| JP | 2008-217406 A | 9/2008 |
| JP | 2008-226099 A | 9/2008 |
| JP | 2008-244739 A | 10/2008 |
| JP | 2008-252517 A | 10/2008 |
| JP | 2008-288915 A | 11/2008 |
| JP | 2008-294491 A | 12/2008 |
| JP | 2009-017284 A | 1/2009 |
| JP | 2009-021970 A | 1/2009 |
| JP | 2009-25870 A | 2/2009 |
| JP | 2009-27291 A | 2/2009 |
| JP | 2009-027291 A | 2/2009 |
| JP | 2009-32765 A | 2/2009 |
| JP | 2009-032765 A | 2/2009 |
| JP | 2009-037413 A | 2/2009 |
| JP | 2009-044647 A | 2/2009 |
| JP | 2009-044715 A | 2/2009 |
| JP | 3148168 U | 2/2009 |
| JP | 2009-065426 A | 3/2009 |
| JP | 2009-110144 A | 5/2009 |
| JP | 2009-111986 A | 5/2009 |
| JP | 2009-130896 A | 6/2009 |
| JP | 2009-135166 A | 6/2009 |
| JP | 2009-524363 A | 6/2009 |
| JP | 2009-153166 A | 7/2009 |
| JP | 4301346 B2 | 7/2009 |
| JP | 2009-181246 A | 8/2009 |
| JP | 2009-182630 A | 8/2009 |
| JP | 2009-213169 A | 9/2009 |
| JP | 2009-213171 | 9/2009 |
| JP | 2009-260758 A | 11/2009 |
| JP | 2009-278441 A | 11/2009 |
| JP | 2009-284182 A | 12/2009 |
| JP | 2010-009196 A | 1/2010 |
| JP | 2010-015342 A | 1/2010 |
| JP | 2010-504598 A | 2/2010 |
| JP | 2010-050844 A | 3/2010 |
| JP | 2010-051012 A | 3/2010 |
| JP | 2010-051017 A | 3/2010 |
| JP | 2010-074839 A | 4/2010 |
| JP | 2010-081571 | 4/2010 |
| JP | 2010-171857 A | 8/2010 |
| JP | 4535209 B2 | 9/2010 |
| JP | 4561932 B2 | 10/2010 |
| JP | 2010-268306 A | 11/2010 |
| JP | 2011-015395 A | 1/2011 |
| JP | 4609604 B2 | 1/2011 |
| JP | 2011-076567 A | 4/2011 |
| JP | 2011-139533 A | 7/2011 |
| JP | 2011-205384 A | 10/2011 |
| JP | 2012-033021 A | 2/2012 |
| NL | 9100176 A | 3/1992 |
| NL | 9100347 A | 3/1992 |
| TW | 200934342 A | 8/2009 |
| TW | 200939925 A | 9/2009 |
| WO | 98/33142 A1 | 7/1998 |
| WO | 99/67754 A1 | 12/1999 |
| WO | 00/10122 A2 | 2/2000 |
| WO | 01/95242 A2 | 12/2001 |
| WO | 02/48980 A1 | 6/2002 |
| WO | 02/061675 A1 | 8/2002 |
| WO | 02/097723 A1 | 12/2002 |
| WO | 03/079305 A1 | 9/2003 |
| WO | 2004/036772 A2 | 4/2004 |
| WO | 2004/070879 A | 8/2004 |
| WO | 2004/072892 A2 | 8/2004 |
| WO | 2005/073937 A | 8/2005 |
| WO | 2005/091434 A1 | 9/2005 |
| WO | 2005/115849 A1 | 12/2005 |
| WO | 2006/045682 A | 5/2006 |
| WO | 2006/048663 A1 | 5/2006 |
| WO | 2006/049068 A1 | 5/2006 |
| WO | 2006/114821 A1 | 11/2006 |
| WO | 2007/013168 A1 | 2/2007 |
| WO | 2007/060792 A1 | 5/2007 |
| WO | 2007/083574 A1 | 7/2007 |
| WO | 2007/083575 A1 | 7/2007 |
| WO | 2007/086130 A1 | 8/2007 |
| WO | 2007/094494 A1 | 8/2007 |
| WO | 2007/097385 A1 | 8/2007 |
| WO | 2007/099602 A1 | 9/2007 |
| WO | 2007/100092 A1 | 9/2007 |
| WO | 2007/102360 A1 | 9/2007 |
| WO | 2007/105348 A1 | 9/2007 |
| WO | 2007/119310 A1 | 10/2007 |
| WO | 2007/125683 A1 | 11/2007 |
| WO | 2007/132094 A1 | 11/2007 |
| WO | 2007/138857 A1 | 12/2007 |
| WO | 2008/001561 A1 | 1/2008 |
| WO | 2008/007606 A | 1/2008 |
| WO | 2008/081699 A1 | 7/2008 |
| WO | 2008/126458 A1 | 10/2008 |
| WO | 2008/133018 A1 | 11/2008 |
| WO | 2008/140037 A1 | 11/2008 |
| WO | 2008/142957 A1 | 11/2008 |
| WO | 2009/005080 A1 | 1/2009 |
| WO | 2009/008296 A1 | 1/2009 |
| WO | 2009/011144 A1 | 1/2009 |
| WO | 2009/011154 A1 | 1/2009 |
| WO | 2009/011376 A1 | 1/2009 |
| WO | 2009/011400 A1 | 1/2009 |
| WO | 2009/011423 A1 | 1/2009 |
| WO | 2009/048767 A1 | 4/2009 |
| WO | 2009/081719 A1 | 7/2009 |
| WO | 2009/110381 A1 | 9/2009 |
| WO | 2009/119548 A1 | 10/2009 |
| WO | 2009/128437 A1 | 10/2009 |
| WO | 2009/140220 A1 | 11/2009 |
| WO | 2009/142114 A1 | 11/2009 |
| WO | 2010/026939 A1 | 3/2010 |
| WO | 2010/050361 A1 | 5/2010 |
| WO | 2010/079830 A1 | 7/2010 |
| WO | 2010/104179 A1 | 9/2010 |
| WO | 2010/119854 A1 | 10/2010 |
| WO | 2011/062274 A1 | 5/2011 |

OTHER PUBLICATIONS

Dokai et al.: "Antenna and Wireless Communication Device"; U.S. Appl. No. 13/613,021, filed Sep. 13, 2012.
Takeoka et al.: "Printed Wiring Board and Wireless Communication System"; U.S. Appl. No. 13/616,140, filed Sep. 14, 2012.
Dokai: "Wireless IC Device, Wireless IC Module and Method of Manufacturing Wireless IC Module"; U.S. Appl. No. 13/688,287, filed Nov. 29, 2012.
Official Communication issued in International Patent Application No. PCT/JP2011/067127, mailed on Oct. 18, 2011.
Kato et al.: "Wireless Communication Device and Metal Article"; U.S. Appl. No. 13/691,996, filed Dec. 3, 2012.

(56) References Cited

OTHER PUBLICATIONS

Yosui: "Antenna Apparatus and Communication Terminal Instrument"; U.S. Appl. No. 13/706,409, filed Dec. 6, 2012.
Official Communication issued in International Patent Application No. PCT/JP2011/071795, mailed on Dec. 27, 2011.
Dokai et al.: "Wireless IC Device"; U.S. Appl. No. 13/738,143, filed Jan. 10, 2013.
Official Communication issued in International Patent Application No. PCT/JP2011/074009, mailed on Dec. 20, 2011.
Kato et al.: "Electromagnetic-Coupling-Module-Attached Article"; U.S. Appl. No. 13/754,972, filed Jan. 31, 2013.
Kimura et al.: "Electrical Product"; U.S. Appl. No. 13/757,991, filed Feb. 4, 2013.
Nakano et al.: "Communication Terminal Device"; U.S. Appl. No. 13/760,196, filed Feb. 6, 2013.
Official Communication issued in International Patent Application No. PCT/JP2011/073054, mailed on Dec. 20, 2011.
Official Communication issued in International Patent Application No. PCT/JP2011/073490, mailed on Jan. 10, 2012.
Kato et al.: "Antenna Device and Communication Terminal Apparatus"; U.S. Appl. No. 13/761,195, filed Feb. 7, 2013.
Kato et al.: "Antenna Device and Mobile Communication Terminal"; U.S. Appl. No. 13/767,960, filed Feb. 15, 2013.
Official Communication issued in International Patent Application No. PCT/JP2012/058884, mailed on Jun. 12, 2012.
Dokai et al.: "Wireless Communication Device"; U.S. Appl. No. 13/782,346, filed Mar. 1, 2013.
Official Communication issued in International Patent Application No. PCT/JP2012/053344, mailed on May 22, 2012.
Official Communication issued in International Patent Application No. PCT/JP2010/066291, mailed on Dec. 28, 2010.
Ikemoto: "Communication Terminal and Information Processing System"; U.S. Appl. No. 13/432,002, filed Mar. 28, 2012.
Official Communication issued in International Patent Application No. PCT/JP2010/070767, mailed on Feb. 22, 2011.
Ieki et al.: "Transceiver and Radio Frequency Identification Tag Reader"; U.S. Appl. No. 13/437,978, filed Apr. 3, 2012.
Official Communication issued in International Patent Application No. PCT/JP2011/065431, mailed on Oct. 18, 2011.
Kato et al.: "Wireless IC Device"; U.S. Appl. No. 13/470,486, filed May 14, 2012.
Kato: "Wireless IC Device"; U.S. Appl. No. 12/789,610, filed May 28, 2010.
Kato: "Antenna and RFID Device"; U.S. Appl. No. 13/472,520, filed May 16, 2012.
Kato et al.: "Wireless IC Device and Component for Wireless IC Device"; U.S. Appl. No. 13/540,694, filed Jul. 3, 2012.
Dokai et al.: "Wireless IC Device and Component for Wireless IC Device"; U.S. Appl. No. 13/567,108, filed Aug. 6, 2012.
Dokai et al.: "Wireless IC Device and Component for Wireless IC Device"; U.S. Appl. No. 13/567,109, filed Aug. 6, 2012.
Official Communication issued in International Patent Application No. PCT/JP2011/052594, mailed on May 17, 2011.
Kato et al.: "Wireless IC Device"; U.S. Appl. No. 13/585,866, filed Aug. 15, 2012.
Kato et al.: "Radio Communication Device and Radio Communication Terminal"; U.S. Appl. No. 13/600,256, filed Aug. 31, 2012.
Murayama et al.: "Wireless Communication Module and Wireless Communication Device"; U.S. Appl. No. 13/598,872, filed Aug. 30, 2012.
Official Communication issued in International Patent Application No. PCT/JP2011/069689, mailed on Oct. 4, 2011.
Official Communication issued in corresponding Japanese Patent Application No. 2011-552116, mailed on Apr. 17, 2012.
Tsubaki et al.: "RFID Module and RFID Device"; U.S. Appl. No. 13/603,627, filed Sep. 5, 2012.
Kato et al.: "Antenna Device and Method of Setting Resonant Frequency of Antenna Device"; U.S. Appl. No. 13/604,807, filed Sep. 6, 2012.
Kato et al.: "Antenna Device and Method of Setting Resonant Frequency of Antenna Device"; U.S. Appl. No. 13/604,801, filed Sep. 6, 2012.
Official Communication issued in International Patent Application No. PCT/JP2011/053656, mailed on May 17, 2011.
Official Communication issued in International Patent Application No. PCT/JP2012/050557, mailed on Apr. 10, 2012.
Kimura et al.: "Wireless Communication Device"; U.S. Appl. No. 13/789,761, filed Mar. 8, 2013.
Dokai et al.: "RFID Chip Package and RFID Tag"; U.S. Appl. No. 13/792,650, filed Mar. 11, 2013.
Kato et al.: "Wireless IC Device Component and Wireless IC Device"; U.S. Appl. No. 13/794,929, filed Mar. 12, 2013.
Kato et al.: "Wireless IC Device and Component for Wireless IC Device"; U.S. Application No. 13/848,748, filed Mar. 22, 2013.
Official Communication issued in International Patent Application No. PCT/JP2012/080493, mailed on Dec. 25, 2012.
Mukai et al.: "Inspection Method and Inspection Device for RFID Tag"; U.S. Appl. No. 13/933,184, filed Jul. 2, 2013.
Kato et al.: "Antenna Device and Method of Setting Resonant Frequency of Antenna Device"; U.S. Appl. No. 13/941,760, filed Jul. 15, 2013.
Kato et al.: "Antenna Device and Method of Setting Resonant Frequency of Antenna Device"; U.S. Appl. No. 13/943,973, filed Jul. 17, 2013.
Official Communication issued in International Patent Application No. PCT/JP2012/080700, mailed on Jan. 15, 2013.
Mukai et al.: "Wireless Integrated Circuit Device and Method of Manufacturing the Same"; U.S. Appl. No. 13/961,995, filed Aug. 8, 2013.
Kato et al.: "Radio IC Device"; U.S. Appl. No. 13/964,234, filed Aug. 12, 2013.
Official Communication issued in International Patent Application No. PCT/JP2012/067779, mailed on Aug. 28, 2012.
Official Communication issued in International Patent Application No. PCT/JP2013/051254, mailed on Apr. 2, 2013.
Dokai: "Wireless Communication Device"; U.S. Appl. No. 13/970,633, filed Aug. 20, 2013.
Official Communication issued in International Patent Application No. PCT/JP2012/059350, mailed on Jul. 3, 2012.
Dokai: "Wireless IC Device"; U.S. Appl. No. 14/011,823, filed Aug. 28, 2013.
Official Communication issued in International Patent Application No. PCT/JP2012/055505, mailed on Jun. 5, 2012.
Kato: "Radio IC Device and Radio Communication Terminal"; U.S. Appl. No. 14/017,406, filed Sep. 4, 2013.
Official Communication issued in International Patent Application No. PCT/JP2012/067454, mailed on Aug. 7, 2012.
Kato: "Antenna Device and Communication Terminal Apparatus"; U.S. Appl. No. 14/019,573, filed Sep. 6, 2013.
Official Communication issued in International Patent Application No. PCT/JP2012/067537, mailed on Oct. 9, 2012.
Kato: "Radio Communication Device"; U.S. Appl. No. 14/027,384, filed Sep. 16, 2013.
Kato: "Antenna Device, RFID Tag, and Communication Terminal Apparatus"; U.S. Appl. No. 14/031,270, filed Sep. 19, 2013.
Kato et al.: Wireless IC Device; U.S. Appl. No. 14/054,865, filed Oct. 16, 2013.
Official communication issued in Japanese Application No. 2007-531524, mailed on Sep. 11, 2007.
Official communication issued in Japanese Application No. 2007-531525, mailed on Sep. 25, 2007.
Official communication issued in Japanese Application No. 2007-531524, mailed on Dec. 12, 2007.
Official communication issued in European Application No. 07706650.4, mailed on Nov. 24, 2008.
Mukku-Sha, "Musen IC Tagu Katsuyo-no Subete" "(All About Wireless IC Tags")", RFID, pp. 112-126.
Dokai et al.: "Wireless IC Device and Componenet for Wireless IC Device"; U.S. Appl. No. 11/624,382, filed Jan. 18, 2007.
Dokai et al.: "Wireless IC Device, and Component for Wireless IC Device"; U.S. Appl. No. 11/930,818, filed Oct. 31, 2007.

(56) References Cited

OTHER PUBLICATIONS

Kato et al.: "Wireless IC Device"; U.S. Appl. No. 12/042,399, filed Mar. 5, 2008.
Official communication issued in related U.S. Appl. No. 12/042,399; mailed on Aug. 25, 2008.
English translation of NL9100176, published on Mar. 2, 1992.
English translation of NL9100347, published on Mar. 2, 1992.
Kato et al.: "Antenna"; U.S. Appl. No. 11/928,502, filed Oct. 30, 2007.
Kato et al.: "Wireless IC Device"; U.S. Appl. No. 12/211,117, filed Sep. 16, 2008.
Kato et al.: "Antenna"; U.S. Appl. No. 11/688,290, filed Mar. 20, 2007.
Kato et al.: "Electromagnetic-Coupling-Module-Attached Article"; U.S. Appl. No. 11/740,509, filed Apr. 26, 2007.
Kato et al.: "Product Including Power Supply Circuit Board"; U.S. Appl. No. 12/234,949, filed Sep. 22, 2008.
Kato et al.: "Data Coupler"; U.S. Appl. No. 12/252,475, filed Oct. 16, 2008.
Kato et al.; "Information Terminal Device"; U.S. Appl. No. 12/267,666, filed Nov. 10, 2008.
Kato et al.: "Wireless IC Device and Wireless IC Device Composite Component"; U.S. Appl. No. 12/276,444, filed Nov. 24, 2008.
Dokai et al.: "Optical Disc"; U.S. Appl. No. 12/326,916, filed Dec. 3, 2008.
Dokai et al.: "System for Inspecting Electromagnetic Coupling Modules and Radio IC Devices and Method for Manufacturing Electromagnetic Coupling Modules and Radio IC Devices Using the System"; U.S. Appl. No. 12/274,400, filed Nov. 20, 2008.
Kato: "Wireless IC Device"; U.S. Appl. No. 11/964,185, filed Dec. 26, 2007.
Kato et al.: "Radio Frequency IC Device"; U.S. Appl. No. 12/336,629, filed Dec. 17, 2008.
Kato et al.: "Wireless IC Device and Component for Wireless IC Device"; U.S. Appl. No. 12/339,198, filed Dec. 19, 2008.
Ikemoto et al.: "Wireless IC Device"; U.S. Appl. No. 11/851,651, filed Sep. 7, 2007.
Kataya et al.: "Wireless IC Device and Electronic Device"; U.S. Appl. No. 11/851,661, filed Sep. 7, 2007.
Dokai et al.: "Antenna and Radio IC Device"; U.S. Appl. No. 12/350,307, filed Jan. 8, 2009.
Official Communication issued in International Patent Application No. PCT/JP2009/066336, mailed on Dec. 22, 2009.
Official Communication issued in corresponding Japanese Patent Application No. 2010-509439, mailed on Jul. 6, 2010.
Official Communication issued in corresponding Japanese Patent Application No. 2011-032311, mailed on Mar. 29, 2011.
Official Communication issued in corresponding Japanese Patent Application No. 2009-525327, drafted on Sep. 22, 2010.
Official Communication issued in corresponding Japanese Patent Application No. 2011-032311, mailed on Aug. 2, 2011.
Official Communication issued in corresponding Japanese Patent Application No. 2011-032312, mailed on Aug. 2, 2011.
Official Communication issued in corresponding Japanese Patent Application No. 2011-032311, mailed on Aug. 23, 2011.
Kato et al.: "Wireless IC Device Component and Wireless IC Device"; U.S. Appl. No. 13/241,823, filed Sep. 23, 2011.
Kato et al.: "Antenna Device and Method of Setting Resonant Frequency of Antenna Device"; U.S. Appl. No. 13/272,365; filed Oct. 13, 2011.
Official Communication issued in International Patent Application No. PCT/JP2010/056812, mailed on Jul. 13, 2010.
Dokai et al.: "Optical Disc"; U.S. Appl. No. 13/295,153, filed Nov. 14, 2011.
Official Communication issued in International Patent Application No. PCT/JP2010/057668, mailed on Aug. 17, 2010.
Osamura et al.: "Radio Frequency IC Device and Method of Manufacturing the Same"; U.S. Appl. No. 13/308,575, filed Dec. 1, 2011.
Official Communication issued in International Patent Application No. PCT/JP2010/069417, mailed on Dec. 7, 2010.
Kato: "Wireless IC Device and Coupling Method for Power Feeding Circuit and Radiation Plate"; U.S. Appl. No. 13/325,273, filed Dec. 14, 2011.
Official Communication issued in International Patent Application No. PCT/JP2010/053496, mailed on Jun. 1, 2010.
Ikemoto: "Wireless IC Tag, Reader-Writer, and Information Processing System"; U.S. Appl. No. 13/329,354, filed Dec. 19, 2011.
Kato et al.: "Antenna and Antenna Module"; U.S. Appl. No. 13/334,462, filed Dec. 22, 2011.
Official Communication issued in International Patent Application No. PCT/JP2010/069418, mailed on Feb. 8, 2011.
Official Communication issued in International Patent Application No. PCT/JP2010/063082, mailed on Nov. 16, 2010.
Ikemoto: "Communication Terminal and Information Processing System"; U.S. Appl. No. 13/412,772, filed Mar. 6, 2012.
"Antenna Engineering Handbook", The Institute of Electronics and Communication Engineers, Mar. 5, 1999, pp. 20-21.
Official Communication issued in International Patent Application No. PCT/JP2010/066714, mailed on Dec. 14, 2010.
Nomura et al.: "Antenna and Wireless IC Device"; U.S. Appl. No. 13/419,454, filed Mar. 14, 2012.
Official Communication issued in International Patent Application No. PCT/JP2010/070607, mailed on Feb. 15, 2011.
Ito: "Wireless IC Device and Method of Detecting Environmental State Using the Device"; U.S. Appl. No. 13/421,889, filed Mar. 16, 2012.
Official Communication issued in International Patent Application No. PCT/JP2011/053654, mailed on Mar. 29, 2011.
Kato et al.: "Antenna Device and Mobile Communication Terminal"; U.S. Appl. No. 13/425,505, filed Mar. 21, 2012.
Official Communication issued in International Patent Application No. PCT/JP2010/069416, mailed on Feb. 8, 2011.
Kato et al.: "Wireless Communication Device and Metal Article"; U.S. Appl. No. 13/429,465, filed Mar. 26, 2012.
Official Communication issued in International Patent Application No. PCT/JP2011/055344, mailed on Jun. 14, 2011.
Kubo et al.: "Antenna and Mobile Terminal"; U.S. Appl. No. 13/452,972, filed Apr. 23, 2012.
Ikemoto: "RFID System"; U.S. Appl. No. 13/457,525, filed Apr. 27, 2012.
Ikemoto et al.: "Wireless IC Device and Electronic Apparatus"; U.S. Appl. No. 13/468,058, filed May 10, 2012.
Official Communication issued in International Patent Application No. PCT/JP2010/066788, mailed on Dec. 21, 2010.
Official Communication issued in International Patent Application No. PCT/JP2009/069486, mailed on Mar. 2, 2010.
Kato: "Radio IC Device"; U.S. Appl. No. 13/080,775, filed Apr. 6, 2011.
Kato et al.: "Antenna and Wireless IC Device"; U.S. Appl. No. 13/083,626, filed Apr. 11, 2011.
Official Communication issued in International Patent Application No. PCT/JP2009/070617, mailed on Mar. 16, 2010.
Nagai, "Mounting Technique of RFID by Roll-To-Roll Process", Material Stage, Technical Information Institute Co., Ltd, vol. 7, No. 9, 2007, pp. 4-12.
Dokai et al.: "Wireless IC Device"; U.S. Appl. No. 13/088,480, filed Apr. 18, 2011.
Kato et al.: "High-frequency Device and Wireless IC Device"; U.S. Appl. No. 13/094,928, filed Apr. 27, 2011.
Dokai et al.: "Wireless IC Device"; U.S. Appl. No. 13/099,392, filed May 3, 2011.
Kato et al.: "Radio Frequency IC Device"; U.S. Appl. No. 13/163,803, filed Jun. 20, 2011.
Official Communication issued in International Patent Application No. PCT/JP2010/050170, mailed on Apr. 13, 2010.
Official Communication issued in International Patent Application No. PCT/JP2010/051205, mailed on May 11, 2010.
Kato: "Wireless IC Device, Wireless IC Module and Method of Manufacturing Wireless IC Module"; U.S. Appl. No. 13/169,067, filed Jun. 27, 2011.
Kato et al.: "Antenna and Wireless IC Device"; U.S. Appl. No. 13/190,670, filed Jul. 26, 2011.

(56) References Cited

OTHER PUBLICATIONS

Shiroki et al.: "RFIC Chip Mounting Structure"; U.S. Appl. No. 13/223,429, filed Sep. 1, 2011.
Official Communication issued in International Patent Application No. PCT/JP2010/056559, mailed on Jul. 27, 2010.
Taniguchi et al.: "Antenna Device and Radio Frequency IC Device"; U.S. Appl. No. 13/232,102, filed Sep. 14, 2011.
Official Communication issued in International Patent Application No. PCT/JP2009/056934, mailed on Jun. 30, 2009.
Kato et al.: "Wireless IC Device"; U.S. Appl. No. 12/903,242, filed Oct. 13, 2010.
Kato et al.: "Wireless IC Device"; U.S. Appl. No. 12/940,103, filed Nov. 5, 2010.
Kato et al.: "Wireless IC Device System and Method of Determining Authenticity of Wirelesss IC Device"; U.S. Appl. No. 12/940,105, filed Nov. 5, 2010.
Official Communication issued in International Patent Application No. PCT/JP2009/059669, mailed on Aug. 25, 2009.
Official Communication issued in International Patent Application No. PCT/JP2009/062181, mailed on Oct. 13, 2009.
Official Communication issued in corresponding Japanese Application No. 2010-501323, mailed on Apr. 6, 2010.
Kato et al.: "Component of Wireless IC Device and Wireless IC Device"; U.S. Appl. No. 12/944,099, filed Nov. 11, 2010.
Kato et al.: Wireless IC Device and Manufacturing Method Thereof; U.S. Appl. No. 12/961,599, filed Dec. 7, 2010.
Kataya et al.: "Radio Frequency IC Device and Electronic Apparatus"; U.S. Appl. No. 12/959,454, filed Dec. 3, 2010.
Ikemoto et al.:"Radio IC Device"; U.S. Appl. No. 12/981,582, filed Dec. 30, 2010.
Official Communication issued in International Patent Application No. PCT/JP2009/062801, mailed on Oct. 27, 2009.
Ikemoto et al.: "Wireless IC Device and Electronic Apparatus"; U.S. Appl. No. 13/022,695, filed Feb. 8, 2011.
Official Communication issued in International Patent Application No. PCT/JP2009/067778, mailed on Jan. 26, 2010.
Kato: "Wireless IC Device and Method for Manufacturing Same"; U.S. Appl. No. 13/022,693, filed Feb. 8, 2011.
Kato: "Wireless IC Device"; U.S. Appl. No. 13/080,781, filed Apr. 6, 2011.
Official communication issued in counterpart European Application No. 08 77 7758, dated on Jun. 30, 2009.
Official communication issued in counterpart Japanese Application No. 2008-103741, mailed on May 26, 2009.
Official communication issued in counterpart Japanese Application No. 2008-103742, mailed on May 26, 2009.
Official communication issued in International Application No. PCT/JP2008/050358, mailed on Mar. 25, 2008.
Official communication issued in International Application No. PCT/JP2008/050356, mailed on Mar. 25, 2008.
Osamura et al.: "Packaging Material With Electromagnetic Coupling Module," U.S. Appl. No. 12/536,669, filed Aug. 6, 2009.
Dokai et al.: "Wireless IC Device and Component for Wireless IC Device," U.S. Appl. No. 12/543,553, filed Aug. 19, 2009.
Shioya et al.: "Wireless IC Device," U.S. Appl. No. 12/551,037, filed Aug. 31, 2009.
Ikemoto: "Wireless IC Device and Manufacturing Method Thereof," U.S. Appl. No. 12/579,672, filed Oct. 15, 2009.
Official communication issued in International Application No. PCT/JP2008/058614, mailed on Jun. 10, 2008.
Official communication issued in counterpart International Application No. PCT/JP2008/071502, mailed Feb. 24, 2009.
Kato et al.: "Wireless IC Device and Manufacturing Method Thereof," U.S. Appl. No. 12/432,854, filed Apr. 30, 2009.
Official communication issued in counterpart International Application No. PCT/JP2008/058168, mailed Aug. 12, 2008.
Official communication issued in counterpart International Application No. PCT/JP2008/062886, mailed Oct. 21, 2008.
Kato et al.: "Wireless IC Device," U.S. Appl. No. 12/469,896, filed May 21, 2009.
Ikemoto et al.: "Wireless IC Device," U.S. Appl. No. 12/496,709, filed Jul. 2, 2009.
Official communication issued in counterpart International Application No. PCT/JP2008/062947, mailed Aug. 19, 2008.
Official communication issued in counterpart International Application No. PCT/JP2008/056026, mailed Jul. 1, 2008.
Ikemoto et al.: "Wireless IC Device and Electronic Apparatus," U.S. Appl. No. 12/503,188, filed Jul. 15, 2009.
Official communication issued in counterpart International Application No. PCT/JP2008/055567, mailed May 20, 2008.
Official communication issued in counterpart International Application No. PCT/JP2008/051853, mailed Apr. 22, 2008.
Official communication issued in counterpart International Application No. PCT/JP2008/057239, mailed Jul. 22, 2008.
Kimura et al.: "Wireless IC Device," U.S. Appl. No. 12/510,338, filed Jul. 28, 2009.
Kato et al.: "Wireless IC Device," U.S. Appl. No. 12/510,340, filed Jul. 28, 2009.
Kato: "Wireless IC Device," U.S. Appl. No. 12/510,344, filed Jul. 28, 2009.
Kato et al.: "Wireless IC Device," U.S. Appl. No. 12/510,347, filed Jul. 28, 2009.
Official Communication issued in International Application No. PCT/JP2007/066007, mailed on Nov. 27, 2007.
Dokai et al.: "Wireless IC Device and Component for Wireless IC Device"; U.S. Appl. No. 12/359,690, filed Jan. 26, 2009.
Dokai et al.: "Test System for Radio Frequency IC Devices and Method of Manufacturing Radio Frequency IC Devices Using the Same"; U.S. Appl. No. 12/388,826, filed Feb. 19, 2009.
Official Communication issued in International Application No. PCT/JP2008/061955, mailed on Sep. 30, 2008.
Official Communication issued in International Application No. PCT/JP2007/066721, mailed on Nov. 27, 2007.
Official Communication issued in International Application No. PCT/JP2007/070460, mailed on Dec. 11, 2007.
Kato et al.: "Wireless IC Device"; U.S. Appl. No. 12/390,556, filed Feb. 23, 2009.
Kato et al.: "Inductively Coupled Module and Item With Inductively Coupled Module"; U.S. Appl. No. 12/398,497, filed Mar. 5, 2009.
Official Communication issued in International Patent Application No. PCT/JP2008/050945, mailed on May 1, 2008.
Kato et al.: "Article Having Electromagnetic Coupling Module Attached Thereto"; U.S. Appl. No. 12/401,767, filed Mar. 11, 2009.
Taniguchi et al.: "Antenna Device and Radio Frequency IC Device"; U.S. Appl. No. 12/326,117, filed Dec. 2, 2008.
Official Communication issued in International Patent Application No. PCT/JP2008/061442, mailed on Jul. 22, 2008.
Kato et al.: "Container With Electromagnetic Coupling Module"; U.S. Appl. No. 12/426,369, filed Apr. 20, 2009.
Kato: "Wireless IC Device"; U.S. Appl. No. 12/429,346, filed Apr. 24, 2009.
Official Communication issued in International Patent Application No. PCT/JP2008/063025, mailed on Aug. 12, 2008.
Kato et al.: "Wireless IC Device," U.S. Appl. No. 12/603,608, filed Oct. 22, 2009.
Kato et al.: "Wireless IC Device," U.S. Appl. No. 12/688,072, filed Jan. 15, 2010.
Official Communication issued in International Patent Application No. PCT/JP2009/053693, mailed on Jun. 9, 2009.
Kato: "Composite Antenna,"U.S. Appl. No. 12/845,846, filed Jul. 29, 2010.
Official Communication issued in International Patent Application No. PCT/JP2009/053690, mailed on Jun. 2, 2009.
Kato et al.: "Radio Frequency IC Device and Radio Communication System," U.S. Appl. No. 12/859,340, filed Aug. 19, 2010.
Official Communication issued in International Patent Application No. PCT/JP2009/055758, mailed on Jun. 23, 2009.
Kato et al.: "Wireless IC Device," U.S. Appl. No. 12/859,880, filed Aug. 20, 2010.
Official Communication issued in International Patent Application No. PCT/JP2009/057482, mailed on Jul. 21, 2009.

(56) References Cited

OTHER PUBLICATIONS

Kataya et al.: "Wireless IC Device, Electronic Apparatus, and Method for Adjusting Resonant Frequency of Wireless IC Device," U.S. Appl. No. 12/861,945, filed Aug. 24, 2010.

Kato: "Wireless IC Device and Electromagnetic Coupling Module," U.S. Appl. No. 12/890,895, filed Sep. 27, 2010.

Official Communication issued in International Patent Application No. PCT/JP2009/059410, mailed on Aug. 4, 2009.

Kato et al.: "Wireless IC Device" U.S. Appl. No. 12/902,174, filed Oct. 12, 2010.

Official Communication issued in International Patent Application No. PCT/JP2009/059259, mailed on Aug. 11, 2009.

Official Communication issued in corresponding Japanese Patent Application No. 2010-506742, mailed on Apr. 6, 2010.

Official Communication issued in International Patent Application No. PCT/JP2009/056698, mailed on Jul. 7, 2009.

Kato et al., "Circuit Substrate and Method of Manufacturing Same", U.S. Appl. No. 13/430,736, filed Mar. 27, 2012.

Official Communication issued in corresponding Chinese Patent Application No. 201080044993.2, mailed on Apr. 30, 2014.

* cited by examiner

CIRCUIT SUBSTRATE AND METHOD OF MANUFACTURING SAME

BACKGROUND OF THE INVENTION

1. Field of the Invention

The present invention relates to a circuit substrate and a method of manufacturing the same and, in particular, to a circuit substrate including a rigid region and a flexible region and a method of manufacturing the same.

2. Description of the Related Art

One known example of a traditional circuit substrate is a wiring substrate described in Japanese Unexamined Patent Application Publication No. 2006-339186. The wiring substrate described in Japanese Unexamined Patent Application Publication No. 2006-339186 includes a flexible section and a rigid section disposed to be contiguous to the flexible section. The flexible section includes a flexible substrate in which wiring patterns are stacked such that an insulative resin layer is disposed therebetween. The rigid section includes a flexible substrate formed integrally with the flexible section. The wiring density of the wiring patterns in the rigid section is higher than that in the flexible section. Thus, the rigid section has a higher hardness than that of the flexible section.

However, for the wiring substrate described in Japanese Unexamined Patent Application Publication No. 2006-339186, the stray capacitance may increase, and the circuit characteristics may deviate from a desired value. More specifically, for the wiring substrate described in Japanese Unexamined Patent Application Publication No. 2006-339186, to have a higher wiring density of the wiring patterns in the rigid section than that in the flexible section, a redundant wiring pattern is disposed in the rigid section. The redundant wiring pattern faces other wiring patterns and forms unnecessary stray capacitance. As a result, the circuit characteristics in the wiring substrate described in Japanese Unexamined Patent Application Publication No. 2006-339186 deviate from a desired value.

SUMMARY OF THE INVENTION

Preferred embodiments of the present invention provide a circuit substrate and a method of manufacturing the circuit substrate, the circuit substrate having circuit characteristics in which the occurrence of deviations can be reduced and including a relatively hard region and a relatively soft region.

A circuit substrate according to a preferred embodiment of the present invention includes a main body including a stack of a plurality of first insulator layers made of a flexible material, the main body including a rigid region and a flexible region, the flexible region being more easily deformable than the rigid region, a conductive layer disposed in the main body and forming circuitry, and a second insulator layer disposed so as to cover at least a portion of an area where the conductive layer is not disposed in the rigid region on at least one of the first insulator layers when seen in plan view from a stacking direction.

A method of manufacturing a circuit substrate according to another preferred embodiment of the present invention includes a step of preparing a plurality of first insulator layers on which circuitry made of a conductive layer is formed, the plurality of first insulator layers being made of a flexible material, a step of forming a second insulator layer so as to cover at least a portion of an area where the conductive layer is not disposed on at least one of the first insulator layers when seen in plan view from a stacking direction, and a step of stacking and press-bonding the plurality of first insulator layers.

According to various preferred embodiments of the present invention, a circuit substrate that has circuit characteristics in which the occurrence of deviations can be reduced and that includes a relatively hard region and a relatively soft region is obtainable.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

A circuit substrate and a method of manufacturing the same according to preferred embodiments of the present invention are described below with reference to the drawings.

Figure 1:
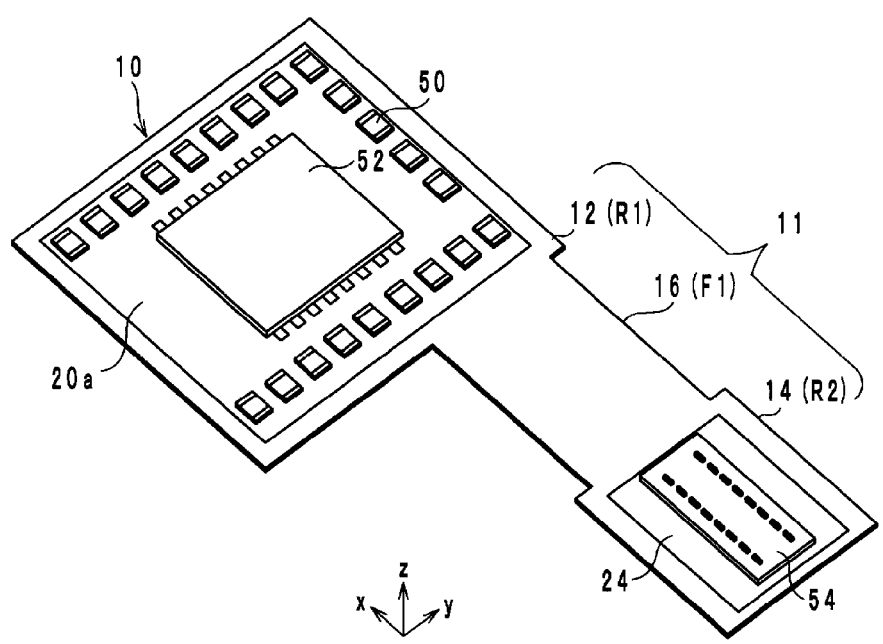
FIG. 1 is an external perspective view of a circuit substrate according to a preferred embodiment of the present invention.
Figure 2:
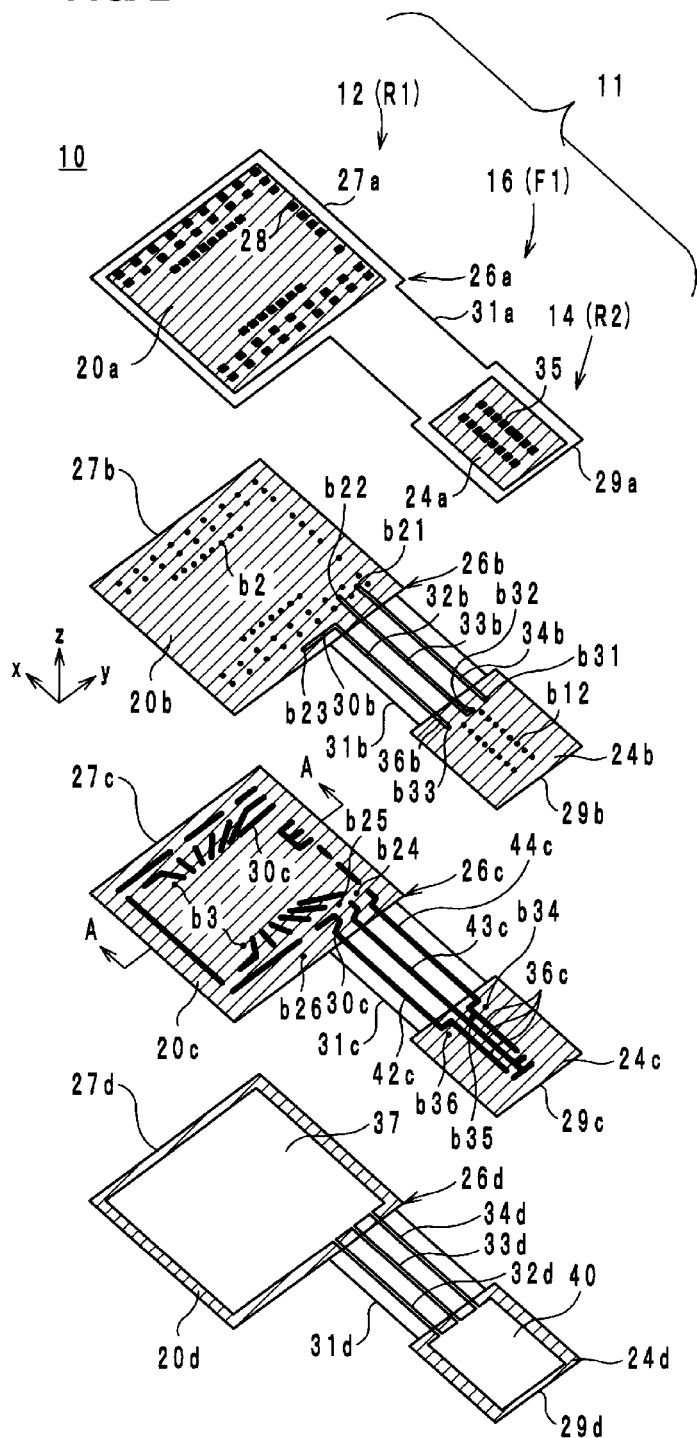
FIG. 2 is an exploded perspective view of the circuit substrate illustrated in FIG. 1.
Figure 3A:
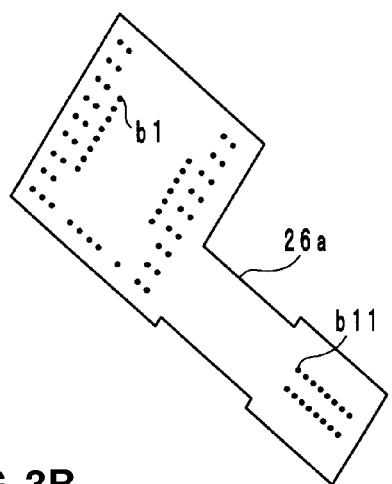
FIGS. 3A and 3B are perspective views of a flexible sheet in the circuit substrate in its manufacturing process.
Figure 3B:
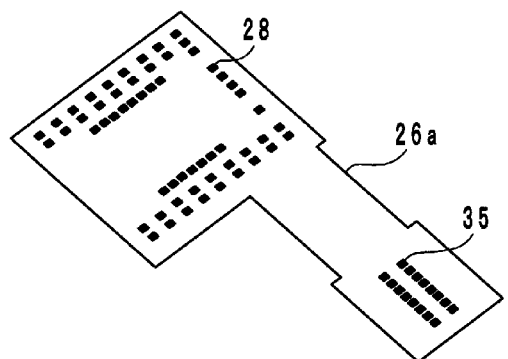
Figure 4:
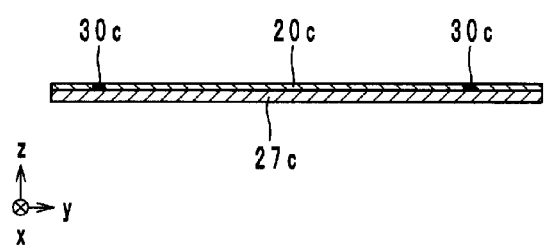
FIG. 4 is a cross-sectional configuration view of the circuit substrate illustrated in FIG. 2 taken along the line A-A.

A configuration of a circuit substrate according to a preferred embodiment of the present invention is described below with reference to the drawings. FIG. 1 is an external perspective view of a circuit substrate 10 according to a preferred embodiment of the present invention. FIG. 2 is an exploded perspective view of the circuit substrate 10 illustrated in FIG. 1. FIGS. 3A and 3B are perspective views of a flexible sheet 26a in the circuit substrate 10 in its manufacturing process. FIG. 3A illustrates the back side of the flexible sheet 26a, and FIG. 3B illustrates the front side of the flexible sheet 26a in a state where resist films 20a and 24a are not formed. FIG. 4 is a cross-sectional configuration view of the circuit substrate 10 illustrated in FIG. 2 taken along the line A-A. In FIGS. 1 to 4, the stacking direction of the circuit substrate 10 is defined as the z-axis direction, the longitudinal direction of a line section 16 in the circuit substrate 10 is defined as the x-axis direction, and the direction to which the x-axis direction and the z-axis direction are orthogonal is defined as the y-axis direction. The front side of each of the circuit substrate 10 and the flexible sheets 26 indicates a surface positioned on the positive-direction side in the z-axis direction, and the back side of each of the circuit substrate 10 and the flexible sheet 26 indicates a surface positioned on the negative-direction side in the z-axis direction.

As illustrated in FIG. 1, the circuit substrate 10 includes a main body 11 including substrate sections 12 and 14 and the line section 16. As illustrated in FIG. 2, the main body 11 includes a stack of a plurality of (for example, preferably four in FIG. 2) flexible sheets (insulator layers) 26 (26a to 26d) made of a flexible material (e.g., thermoplastic resin, such as liquid crystal polymer or polyimide). Each of the flexible sheets 26 preferably has a Young's modulus of approximately 2 GPa to 20 GPa, for example.

The substrate section 12 is substantially rectangular and includes, on the front side, an implementation surface on which a plurality of chip components 50 and an integrated circuit 52 are implemented. The substrate section 14 has the shape of a substantially rectangle smaller than the substrate section 12 and includes, on the front side, an implementation surface on which a connector 54 is implemented. The substrate sections 12 and 14 are not prone to deforming (bending) to allow the chip components 50, integrated circuit 52, and connector 54 to be stably implemented therein. Hereinafter, the substrate sections 12 and 14 are also referred to as rigid regions R1 and R2, respectively. The line section 16 connects the substrate sections 12 and 14 together. The circuit substrate 10 is used in a state where the line section 16 is curved in a substantially U shape. The line section 16 is easily deformable (bendable). Hereinafter, the line section 16 is also referred to as a flexible region F1.

First, the substrate section 12 (rigid region R1) is described. As illustrated in FIG. 2, the substrate section 12 includes a stack of substrate-section sheets 27a to 27d of the flexible sheets 26a to 26d. As illustrated in FIGS. 1 to 3, the substrate section 12 includes the resist film 20a, reinforcing insulative films 20b to 20d, lands 28, wiring conductors 30 (30b, 30c), a ground conductor 37, and via-hole conductors b1 to b3 and b21 to b26. In FIGS. 1 to 3, reference numerals are provided to only representative ones of the lands 28, the wiring conductors 30, and the via-hole conductors b1 to b3 to prevent complication in the drawings.

Each of the substrate-section sheets 27a to 27d of the flexible sheets 26a to 26d corresponds to a first insulator layer according to a preferred embodiment of the present invention, and each of the reinforcing insulative films 20b to 20d corresponds to a second insulator layer according to a preferred embodiment of the present invention. The same applies to variations described below.

The lands 28 are disposed in the main body 11 and, preferably are defined by a conductive layer disposed on the front side of the substrate-section sheet 27a, as illustrated in FIG. 2. The chip components 50 and the integrated circuit 52 are implemented on the lands 28 preferably by soldering, for example, as illustrated in FIG. 1.

As illustrated in FIG. 3A, the via-hole conductors b1 penetrate through the substrate-section sheet 27a along the z-axis direction. The via-hole conductors b1 are connected to the lands 28.

The wiring conductors 30b are disposed in the main body 11 and, preferably are a conductive layer disposed on the front side of the substrate-section sheet 27b, as illustrated in FIG. 2. The via-hole conductors b2 penetrate through the substrate-section sheet 27b along the z-axis direction, as illustrated in FIG. 2. The via-hole conductors b2 are connected to the via-hole conductors b1. As illustrated in FIG. 2, the via-hole conductors b21 to b23 penetrate through the substrate-section sheet 27b along the z-axis direction. The via-hole conductors b21 to b23 are connected to the wiring conductors 30b.

The wiring conductors 30c are disposed in the main body 11 and, preferably are a conductive layer disposed on the front side of the substrate-section sheet 27c, as illustrated in FIG. 2. The via-hole conductors b3 penetrate through the substrate-section sheet 27c along the z-axis direction, as illustrated in FIG. 2. Each of the via-hole conductors b3 is connected to one of the via-hole conductors b2. As illustrated in FIG. 2, the via-hole conductors b24 to b26 penetrate through the substrate-section sheet 27c along the z-axis direction. The via-hole conductors b24 to b26 are connected to the via-hole conductors b21 to b23, respectively.

The ground conductor 37 is disposed in the main body 11 and, preferably is a single film electrode having the shape of a substantially rectangle arranged to cover the front side of the substrate-section sheet 27d. As illustrated in FIG. 2, not all of the substrate-section sheet 27d is covered by the ground conductor 37; the ground conductor 37 is not disposed in the vicinity of the outer regions of the substrate-section sheet 27d. The ground conductor 37 is grounded and thus maintained at a ground potential. The ground conductor 37 is connected to the via-hole conductors b3 and b24 to b26. As described above, the substrate-section sheets 27a to 27d are stacked, and thus the wiring conductors 30b and 30c, the ground conductor 37, and the via-hole conductors b1 to b3 and b21 to b26 are connected to each other and define circuitry.

The resist film 20a is disposed so as to cover the front side of the substrate-section sheet 27a and is an insulative film to protect the substrate-section sheet 27a. The resist film 20a is not disposed on the lands 28. The resist film 20a is a solder resist film to define an area in which solder is to be applied on the lands 28.

The reinforcing insulative film 20b is disposed in the main body 11 and, preferably is an insulative film that covers the portion where the wiring conductors 30b and the via-hole conductors b2 and b21 to b23 are not disposed on the front side of the substrate-section sheet 27b (in the rigid region R1) when seen in plan view from the z-axis direction, as illustrated in FIG. 2. The thickness of the reinforcing insulative film 20b is equal to or less than the thickness of each of the wiring conductors 30b. In the present preferred embodiment, the thickness of the reinforcing insulative film 20b is equal to the thickness of the wiring conductor 30b. The reinforcing insulative film 20b is made of a material that is harder than the material of the substrate-section sheet 27b and can be produced by application of thermosetting resin (e.g., epoxy resin), for example. The reinforcing insulative film 20b preferably has a Young's modulus of approximately 12 GPa to 30 GPa, for example.

The reinforcing insulative film 20c is disposed in the main body 11 and, preferably is an insulative film that covers the portion where the wiring conductors 30c and the via-hole conductors b3 and b24 to b26 are not disposed on the front side of the substrate-section sheet 27c (in the rigid region R1) when seen in plan view from the z-axis direction, as illustrated in FIGS. 2 and 4. The thickness of the reinforcing insulative film 20c is equal to or less than the thickness of each of the wiring conductors 30c, as illustrated in FIG. 4. In the present preferred embodiment, the thickness of the reinforcing insulative film 20c preferably is equal to the thickness of the wiring conductor 30c. The reinforcing insulative film 20c is made of a material harder than the material of the substrate-section sheet 27c and can be produced by application of thermosetting resin (e.g., epoxy resin), for example. The reinforcing insulative film 20c preferably has a Young's modulus of approximately 12 GPa to 30 GPa, for example.

The reinforcing insulative film 20d is disposed in the main body 11 and, preferably is an insulative film that covers the portion where the ground conductor 37 is not disposed on the front side of the substrate-section sheet 27d (in the rigid region R1) when seen in plan view from the z-axis direction, as illustrated in FIG. 2. The thickness of the reinforcing insulative film 20d is equal to or less than the thickness of the ground conductor 37. In the present preferred embodiment, the thickness of the reinforcing insulative film 20d is equal to the thickness of the ground conductor 37. The reinforcing insulative film 20d preferably is made of a material that is harder than the material of the substrate-section sheet 27d and can be produced by application of thermosetting resin (e.g., epoxy resin), for example. The reinforcing insulative film 20d preferably has a Young's modulus of approximately 12 GPa to 30 GPa, for example.

It is preferable that each of these reinforcing insulative films may be disposed in the entire portion where the ground conductor is not disposed on the substrate-section sheet in the substrate section 12 (rigid region R1), as described above. Alternatively, they may be disposed in a portion of the portion where the ground conductor is not disposed. Alternatively, only one of the plurality of substrate-section sheets being stacked may be overlaid with the reinforcing insulative film.

In the case where the reinforcing insulative film is disposed in a portion of an area where the ground conductor is not disposed on the substrate-section sheet, the reinforcing insulative film may preferably be disposed on the substrate-section sheet in the vicinity of the border between the substrate section 12 (rigid region R1) and the line section (flexible region F1). The reinforcing insulative film may preferably be disposed on the substrate-section sheet in a fixation portion fixed on a casing or mother board in the rigid region R1. In addition, in the case where a component is mounted on or incorporated in the rigid region R1, the reinforcing insulative film may preferably be disposed on the substrate-section sheet adjacent to the mounting side, or on each of the substrate-section sheets above and below the component incorporated, in the region that overlaps the component when the circuit substrate 10 is seen in plan view from the stacking direction.

Next, the substrate section 14 (rigid region R2) is described. As illustrated in FIG. 2, the substrate section 14 includes a stack of substrate-section sheets 29a to 29d of the flexible sheets 26a to 26d. As illustrated in FIGS. 1 to 3, the substrate section 14 includes the resist film 24a, reinforcing insulative films 24b to 24d, lands 35, wiring conductors 36 (36b, 36c), a ground conductor 40, and via-hole conductors b11, b12, and b31 to b36. In FIGS. 1 to 3, reference numerals are provided to only representative ones of the lands 35, the wiring conductors 36, and the via-hole conductors b11 and b12 to prevent complication in the drawings.

The lands 35 are disposed in the main body 11 and, preferably are conductive layers disposed on the front side of the substrate-section sheet 29a, as illustrated in FIG. 2. The connector 54 is implemented on the lands 35 preferably by soldering, as illustrated in FIG. 1, for example.

As illustrated in FIG. 3A, the via-hole conductors b11 penetrate through the substrate-section sheet 29a along the z-axis direction. The via-hole conductors b11 are connected to the lands 35.

The wiring conductors 36b are disposed in the main body 11 and, preferably are a conductive layer disposed on the front side of the substrate-section sheet 29b, as illustrated in FIG. 2. The via-hole conductors b12 penetrate through the substrate-section sheet 29b along the z-axis direction, as illustrated in FIG. 2. The via-hole conductors b12 are connected to the via-hole conductors b11. As illustrated in FIG. 2, the via-hole conductors b31 to b33 penetrate through the substrate-section sheet 29b along the z-axis direction. The via-hole conductors b31 to b33 are connected to the wiring conductors 36b.

The wiring conductors 36c are disposed in the main body 11 and, preferably are a conductive layer disposed on the front side of the substrate-section sheet 29c, as illustrated in FIG. 2. The wiring conductors 36c are connected to the via-hole conductors b12. As illustrated in FIG. 2, the via-hole conductors b34 to b36 penetrate through the substrate-section sheet 29c along the z-axis direction. The via-hole conductors b34 to b36 are connected to the via-hole conductors b31 to b33, respectively.

The ground conductor 40 is disposed in the main body 11 and, preferably is a single film electrode having the shape of a substantially rectangle arranged so as to cover the front side of the substrate-section sheet 29d. As illustrated in FIG. 2, not all of the substrate-section sheet 29d is covered by the ground conductor 40; the ground conductor 40 is not disposed in the vicinity of the outer regions of the substrate-section sheet 29d. The ground conductor 40 is grounded and thus maintained at a ground potential. The ground conductor 40 is connected to the via-hole conductors b34 to b36. As described above, the substrate-section sheets 29a to 29d are stacked, and thus the wiring conductors 36b and 36c, the ground conductor 40, and the via-hole conductors b11, b12, and b31 to b36 are connected to each other and define circuitry.

The resist film 24a is disposed so as to cover the front side of the substrate-section sheet 29a and is an insulative film to protect the substrate-section sheet 29a. The resist film 24a is not disposed on the lands 35. The resist film 24a is a solder resist to define an area in which solder is to be applied on the lands 35.

The reinforcing insulative film 24b is disposed in the main body 11 and, preferably is an insulative film that covers the portion where the wiring conductors 36b and the via-hole conductors b12 and b31 to b33 are not disposed on the front side of the substrate-section sheet 29b (in the rigid region R2) when seen in plan view from the z-axis direction, as illustrated in FIG. 2. The thickness of the reinforcing insulative film 24b is equal to or less than the thickness of each of the wiring conductors 36b. In the present preferred embodiment, the thickness of the reinforcing insulative film 24b is equal to the thickness of the wiring conductor 36b. The reinforcing insulative film 24b is preferably made of a material that is harder than the material of the substrate-section sheet 29b and can be produced by application of thermosetting resin (e.g., epoxy resin), for example. The reinforcing insulative film 24b has a Young's modulus of approximately 12 GPa to 30 GPa, for example.

The reinforcing insulative film 24c is disposed in the main body 11 and, preferably is an insulative film that covers the portion where the wiring conductors 36c and the via-hole conductors b34 to b36 are not disposed on the front side of the substrate-section sheet 29c (in the rigid region R2) when seen in plan view from the z-axis direction, as illustrated in FIG. 2. The thickness of the reinforcing insulative film 24c is equal to or less than the thickness of each of the wiring conductors 36c. In the present preferred embodiment, the thickness of the reinforcing insulative film 24c is preferably equal to the thickness of the wiring conductor 36c. The reinforcing insulative film 24c is preferably made of a material that is harder than the material of the substrate-section sheet 29c and can be produced by application of thermosetting resin (e.g., epoxy resin), for example. The reinforcing insulative film 24c has a Young's modulus of approximately 12 GPa to 30 GPa, for example.

The reinforcing insulative film 24d is disposed in the main body 11 and, preferably is an insulative film that covers the portion where the ground conductor 40 is not disposed on the front side of the substrate-section sheet 29d (in the rigid region R2) when seen in plan view from the z-axis direction, as illustrated in FIG. 2. The thickness of the reinforcing insulative film 24d is equal to or less than the thickness of the ground conductor 40. In the present preferred embodiment, the thickness of the reinforcing insulative film 24d is preferably equal or substantially equal to the thickness of the ground conductor 40. The reinforcing insulative film 24d preferably is made of a material that is harder than the material of the substrate-section sheet 29d and can be produced by application of thermosetting resin (e.g., epoxy resin), for example. The reinforcing insulative film 24d preferably has a Young's modulus of approximately 12 GPa to 30 GPa, for example.

Next, the line section 16 (flexible region F1) is described. As illustrated in FIG. 2, the line section 16 includes a stack of line-section sheets 31a to 31d of the flexible sheets 26a to 26d. As illustrated in FIGS. 1 and 2, the line section 16 includes ground lines 32 (32b, 32d), 33 (33b, 33d), and 34 (34b, 34d) and signal lines 42c, 43c, and 44c.

Each of the signal lines 42c, 43c, and 44c is disposed in the main body 11 and, preferably is disposed in the line section 16 and extends between the substrate sections 12 and 14. As illustrated in FIG. 2, each of the signal lines 42c, 43c, and 44c preferably is a linear conductive layer disposed on the front side of the line-section sheet 31c. A signal of a high frequency (e.g., 800 MHz to 900 MHz) is transmitted to the signal lines 42c, 43c, and 44c. As illustrated in FIG. 2, the signal lines 42c, 43c, and 44c connect the wiring conductors 30c and the wiring conductors 36c. That is, the conductive layer including the wiring conductors 30c and 36c and the signal lines 42c, 43c, and 44c extends across the border between the flexible region F1 and each of the rigid regions R1 and R2.

Each of the ground lines 32b, 33b, and 34b is disposed in the main body 11 and, preferably is disposed in the line section 16 and positioned on the positive-direction side in the z-axis direction with respect to the signal lines 42c, 43c, and 44c. As illustrated in FIG. 2, each of the ground lines 32b, 33b, and 34b is disposed on the front side of the line-section sheet 31b and connects the wiring conductor 30b and the wiring conductor 36b. That is, the conductive layer including the wiring conductors 30b and 36b and the ground lines 32b, 33b, and 34b extends across the border between the flexible region F1 and each of the rigid regions R1 and R2. In addition, the wiring conductors 30b are connected to the ground conductor 37 through the via-hole conductors b21 to b26. The wiring conductors 36b are connected to the ground conductor 40 through the via-hole conductors b31 to b36. Accordingly, each of the ground lines 32b, 33b, and 34b is electrically connected to the ground conductor 37. Each of the ground lines 32b, 33b, and 34b is electrically connected to the ground conductor 40.

As illustrated in FIG. 2, the ground lines 32b, 33b, and 34b preferably have line widths that are wider than those of the signal lines 42c, 43c, and 44c, respectively. Therefore when seen in plan view from the z-axis direction, the signal lines 42c, 43c, and 44c do not protrude from the ground lines 32b, 33b, and 34b, respectively, and overlap the ground lines 32b, 33b, and 34b, respectively.

The ground lines 32d, 33d, and 34d are disposed in the line section 16 and positioned on the negative-direction side in the z-axis direction with respect to the signal lines 42c, 43c, and 44c. Specifically, as illustrated in FIG. 2, each of the ground lines 32d, 33d, and 34d is disposed on the front side of the line-section sheet 31d and connects the ground conductor 37 and the ground conductor 40. That is, the conductive layer including the ground conductors 37 and 40 and the ground lines 32d, 33d, and 34d extends across the border between the flexible region F1 and each of the rigid regions R1 and R2.

As illustrated in FIG. 2, the ground lines 32d, 33d, and 34d preferably have line widths that are wider than those of the signal lines 42c, 43c, and 44c, respectively. Therefore, when seen in plan view from the z-axis direction, the signal lines 42c, 43c, and 44c do not protrude from the ground lines 32d, 33d, and 34d, respectively, and overlap the ground lines 32d, 33d, and 34d, respectively.

As described above, the ground lines 32b, 33b, and 34b, the signal lines 42c, 43c, and 44c, and the ground lines 32d, 33d, and 34d overlap each other. Therefore, the ground line 32b, the signal line 42c, and the ground line 32d define a strip line structure. Similarly, the ground line 33b, the signal line 43c, and the ground line 33d define a strip line structure. The ground line 34b, the signal line 44c, and the ground line 34d define a strip line structure. As a result, the impedance between the circuitry in the substrate section 12 and the circuitry in the substrate section 14 is matched. Thus, in the main body 11, the circuitry in the substrate section 12, the circuitry in the substrate section 14, and the strip lines in the line section 16 define a single circuit having matched impedance.

A non-limiting method of manufacturing the circuit substrate 10 according to another preferred embodiment of the present invention is described below with reference to the drawings. In the following description, the case where one circuit substrate 10 is produced is described as an example. In actuality, however, a plurality of circuit substrates 10 preferably are produced at one time by cutting a stack of large flexible sheets.

First, flexible sheets 26 made of thermoplastic resin, such as a liquid crystal polymer or polyimide, and having copper foil with a thickness of 5 μm to 50 μm formed over the front side thereof are prepared. The thickness of each of the flexible sheets 26 is approximately 10 μm to 150 μm. Next, each of the locations where the via-hole conductors b1 to b3, b11, b12, b21 to b26, and b31 to b36 are to be formed in the flexible sheets 26a to 26c (see FIGS. 2 and 3A) is radiated with a laser beam from the back side thereof, thus forming via holes therein.

Next, the lands 28 and 35 illustrated in FIG. 3B are formed on the front side of the flexible sheet 26a by a photolithography step. Specifically, a resist having the same shape as that of each of the lands 28 and 35 illustrated in FIG. 3B is printed on the copper foil of the flexible sheet 26a. The copper foil in the portion that is not covered by the resists is removed by etching performed on the copper foil. After that, the resists are removed. In this way, the lands 28 and 35 illustrated in FIG. 3B are formed on the front side of the flexible sheet 26a. Then the resist films 20a and 24a illustrated in FIGS. 1 and 2 are formed by application of resin on the front side of the flexible sheet 26a.

Next, the wiring conductors 30b and 36b and the ground lines 32b, 33b, and 34b illustrated in FIG. 2 are formed on the front side of the flexible sheet 26b by a photolithography step. The wiring conductors 30c and 36c and the signal lines 42c, 43c, and 44c illustrated in FIG. 2 are formed on the front side of the flexible sheet 26c by a photolithography step. The ground lines 32d, 33d, and 34d and the ground conductors 37 and 40 illustrated in FIG. 2 are formed on the front side of the flexible sheet 26d by a photolithography step. These photolithography steps are substantially the same as the photolithography step used in the formation of the lands 28 and 35, so the description thereof is omitted.

Next, the via holes in the flexible sheets 26a to 26c are filled with conductive paste including an alloy of tin and silver as the principal component, thus forming the via-hole conductors b1 to b3, b11, b12, b21 to b26, and b31 to b36 illustrated in FIGS. 2 and 3A. Through the above-described steps, the flexible sheets, 26a to 26d being made of a flexible material, and on which the circuitry is made are prepared. The circuitry is made up of the wiring conductors 30b, 30c, 36b, and 36c, the ground conductors 37 and 40, the via-hole conductors b1 to b3, b11, b12, b21 to b26, b31 to b36, the ground lines 32b, 33b, 34b, 32d, 33d, and 34d, and the signal lines 42c, 43c, and 44c.

Next, the reinforcing insulative film 20b is formed on the substrate-section sheet 27b by application of resin so as to cover the portion in which the wiring conductors 30b and the via-hole conductors b2 and b21 to b23 are not disposed when seen in plan view from the z-axis direction. The reinforcing insulative film 24b is formed on the substrate-section sheet 29b by application of resin so as to cover the portion in which the wiring conductors 36b and the via-hole conductors b12 and b31 to b33 are not disposed when seen in plan view from the z-axis direction. The reinforcing insulative film 20c is formed on the substrate-section sheet 27c by application of resin so as to cover the portion in which the wiring conductors 30c and the via-hole conductors b3 and b24 to b26 are not disposed when seen in plan view from the z-axis direction. The reinforcing insulative film 24c is formed on the substrate-section sheet 29c by application of resin so as to cover the portion in which the wiring conductors 36c and the via-hole conductors b34 to b36 are not disposed when seen in plan view from the z-axis direction. The reinforcing insulative film 20d is formed on the substrate-section sheet 27d by application of resin so as to cover the portion in which the ground conductor 37 is not disposed when seen in plan view from the z-axis direction. The reinforcing insulative film 24d is formed on the substrate-section sheet 29d by application of resin so as to cover the portion in which the ground conductor 40 is not disposed when seen in plan view from the z-axis direction. The application of resin is made by printing of liquid thermosetting epoxy resin by screen printing, gravure printing, or other process. The thickness of each of the reinforcing insulative films 20b to 20d and 24b to 24d may preferably be about 5 μm to about 50 μm, for example.

Lastly, the flexible sheets 26a to 26d are stacked in this order. The flexible sheets 26a to 26d are press-bonded by the application of force from both sides in the z-axis direction and the application of heat. This causes the unhardened reinforcing insulative films 20b to 20d and 24b to 24d to be hardened and also join the flexible sheets 26 on both sides of the reinforcing insulative films 20b to 20d and 24b to 24d in the z-axis direction such that the reinforcing insulative films 20b to 20d and 24b to 24d are disposed therebetween. In the portion where the flexible sheets 26 are adjacent to each other without the reinforcing insulative films 20b to 20d and 24b to 24d, the surfaces of the flexible sheets 26 flow and the flexible sheets 26 are coupled together. The via-hole conductors b1 to b3, b11, b12, b21 to b26, and b31 to b36, the wiring conductors 30b, 30c, 36b, and 36c, and the ground conductors 37 and 40 are electrically coupled to each other. In this way, the circuit substrate 10 illustrated in FIG. 1 is obtained.

The circuit substrate 10 can have circuit characteristics in which the occurrence of deviations can be reduced and can include relatively hard rigid regions R1 and R2 and relatively soft flexible region F1, as described below. More specifically, in the circuit substrate described in Japanese Unexamined Patent Application Publication No. 2006-339186, a redundant wiring pattern is disposed in the rigid portion. The redundant wiring pattern faces other wiring patterns and generates unnecessary stray capacitance. As a result, the circuit characteristics in the wiring substrate described in Japanese Unexamined Patent Application Publication No. 2006-339186 deviate from a desired value.

In contrast, in the circuit substrate 10, the reinforcing insulative films 20b to 20d and 24b to 24d are disposed in the rigid regions R1 and R2. Specifically, the reinforcing insulative film 20b is disposed on the substrate-section sheet 27b (in rigid region R1) so as to cover the portion where the wiring conductors 30b and the via-hole conductors b2 and b21 to b23 are not disposed. The reinforcing insulative film 24b is disposed on the substrate-section sheet 29b (in the rigid region R2) so as to cover the portion where the wiring conductors 36b and the via-hole conductors b12 and b31 to b33 are not disposed. The reinforcing insulative film 20c is disposed on the substrate-section sheet 27c (in the rigid region R1) so as to cover the portion where the wiring conductors 30c and the via-hole conductors b3 and b24 to b26 are not disposed. The reinforcing insulative film 24c is disposed on the substrate-section sheet 29c (in the rigid region R2) so as to cover the portion where the wiring conductors 36c and the via-hole conductors b34 to b36 are not disposed. The reinforcing insulative film 20d is disposed on the substrate-section sheet 27d (in the rigid region R1) so as to cover the portion where the ground conductor 37 is not disposed. The reinforcing insulative film 24d is disposed on the substrate-section sheet 29d (in the rigid region R2) so as to cover the portion where the ground conductor 40 is not disposed.

As described above, for the circuit substrate 10, the reinforcing insulative films 20b to 20d and 24b to 24d are added in the rigid regions R1 and R2. Therefore, the rigid regions R1 and R2 are harder than the flexible region F1 by the hardness corresponding to the reinforcing insulative films 20b to 20d and 24b to 24d. Thus, the existence of the reinforcing insulative films 20b to 20d and 24b to 24d makes the rigid regions R1 and R2 hard and eliminates the necessity to have an unnecessary conductive layer. Because each of the reinforcing insulative films 20b to 20d and 24b to 24d is not a conductive layer but an insulator layer, no stray capacitance occurs between the reinforcing insulative film and other wiring patterns. Accordingly, the circuit substrate 10 can have circuit characteristics in which the occurrence of deviations can be reduced, and in particular, when it is used in high-frequency ranges, a high-frequency characteristic, such as impedance characteristic, is not prone to change. In addition, the circuit substrate 10 can include the relatively hard rigid regions R1 and R2 and the relatively soft flexible region F1.

In the circuit substrate 10, because the material of each of the reinforcing insulative films 20b to 20d and 24b to 24d is preferably harder than that of each of the flexible sheets 26 (that is, has a larger Young's modulus), the rigid regions R1 and R2 are less prone to deformation.

In the circuit substrate 10, the reinforcing insulative films 20b to 20d and 24b to 24d, which are preferably made of thermosetting resin, are disposed in the rigid regions R1 and R2. Therefore the occurrence of plastic deformation caused by large warping of the rigid regions R1 and R2 in the circuit substrate 10 can be more reduced than that in the case where the rigidity is increased by the use of a metal material.

The circuit substrate 10 can also reduce separation of the flexible sheets 26, as described below. More specifically, the thickness of the reinforcing insulative film 20b is not larger than and substantially the same as that of the wiring conductor 30b. The thickness of the reinforcing insulative film 20c is not larger than and substantially the same as that of the wiring conductor 30c. The thickness of the reinforcing insulative film 20d is not larger than and substantially the same as that of the ground conductor 37. The thickness of the reinforcing insulative film 24b is not larger than and substantially the same as that of the wiring conductor 36b. The thickness of the reinforcing insulative film 24c is not larger than and substantially the same as that of the wiring conductor 36c. The thickness of the reinforcing insulative film 24d is not larger than and substantially the same as that of the ground conductor 40. Accordingly, the existence of the reinforcing insulative films 20b to 20d and 24b to 24d can reduce differences in height occurring on the front sides of the flexible sheets 26 caused by the wiring conductors 30b, 30c, 36b, and 36c and the ground conductors 37 and 40. Therefore, gaps are prevented from being formed between the flexible sheets 26 when the flexible sheets 26 are press-bonded. As a result, the flexible sheets 26 are firmly attached together and are not prone to being separated. Because the reinforcing insulative films 20b to 20d and 24b to 24d accommodate differences in height caused by the thicknesses of the wiring conductors 30b, 30c, 36b, and 36c and the ground conductors 37 and 40, the surface flatness in the circuit substrate 10, which is a lamination of the flexible sheets 26, can be improved.

Figure 5:
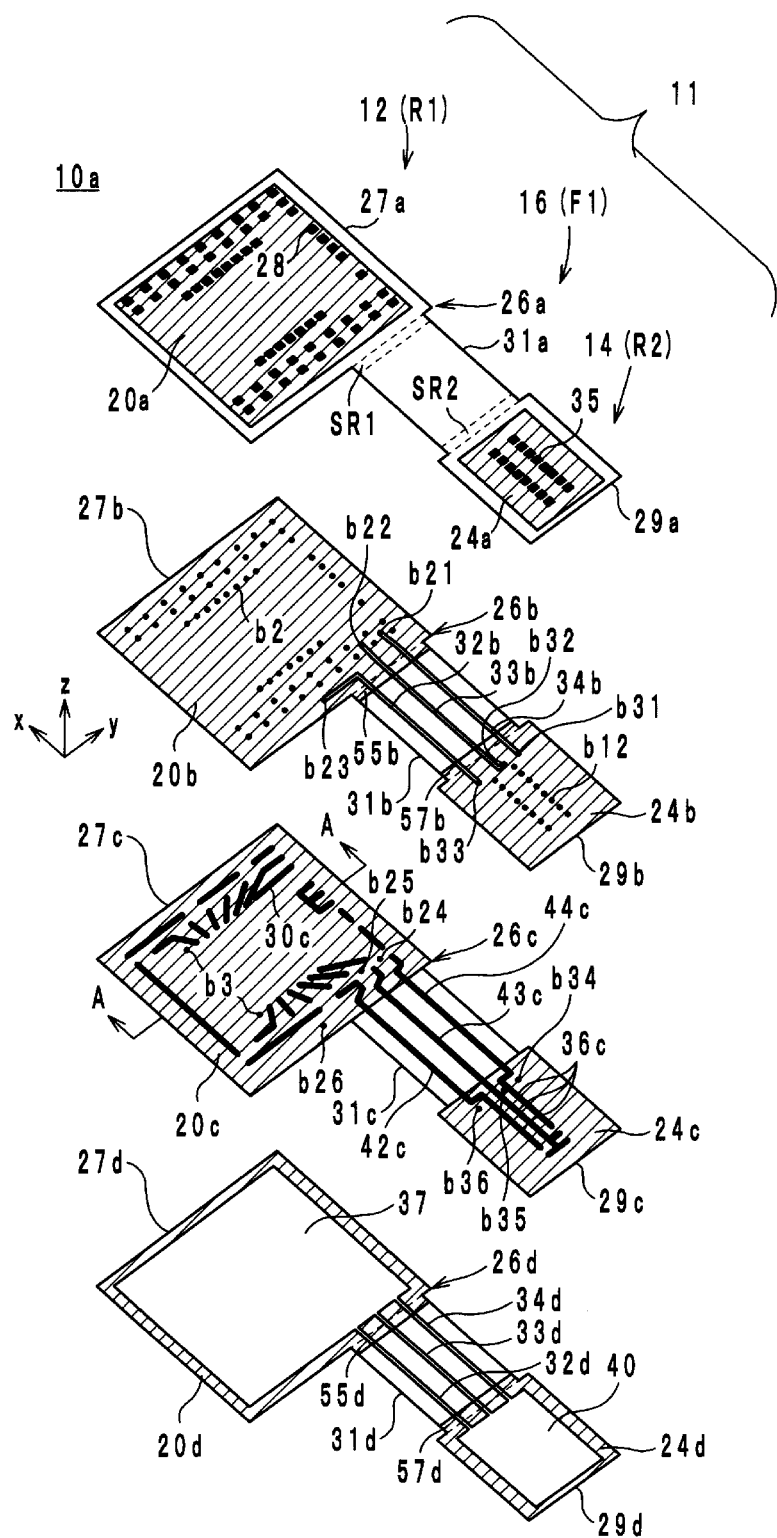
FIG. 5 is an exploded perspective view of a circuit substrate according to a first variation of a preferred embodiment of the present invention.

A circuit substrate 10a according to a first variation of a preferred embodiment of the present invention is described below with reference to the drawing. FIG. 5 is an exploded perspective view of the circuit substrate 10a according to the first variation.

In the circuit substrate 10a, the main body 11 includes semi-rigid regions SR1 and SR2, in addition to the rigid regions R1 and R2 and the flexible region F1. The semi-rigid region SR1 is disposed between the rigid region R1 and the flexible region F1. The semi-rigid region SR2 is disposed between the rigid region R2 and the flexible region F1. The rigid regions R1 and R2 are less deformable than the semi-rigid regions SR1 and SR2. The flexible region F1 is more easily deformable than the semi-rigid regions SR1 and SR2. The semi-rigid regions SR1 and SR2 are configured such that both ends of the flexible region F1 in the x-axis direction are hard. Specifically, to form the semi-rigid regions SR1 and SR2, reinforcing insulative films 55 (55b, 55d) and 57 (57b, 57d) are disposed.

More specifically, the reinforcing insulative films 55b and 57b are disposed so as to cover the portions where the ground lines 32b, 33b, and 34b are not disposed in the semi-rigid regions SR1 and SR2, respectively, on the line-section sheet 31b when seen in plan view from the z-axis direction. The reinforcing insulative films 55d and 57d are disposed so as to cover the portions where the ground lines 32d, 33d, and 34d are not disposed in the semi-rigid regions SR1 and SR2, respectively, on the line-section sheet 31d when seen in plan view from the z-axis direction.

The above-described circuit substrate 10a can reduce the occurrence of breakage in the main body 11 at the border between the flexible region F1 and each of the rigid regions R1 and R2. More specifically, when the semi-rigid regions SR1 and SR2 are not disposed between the rigid regions R1 and R2 and the flexible region F1, the hardness of the main body 11 significantly varies at the border between the flexible region F1 and each of the rigid regions R1 and R2. If the line section (flexible region F1) is bent, stress concentrates on the border between the flexible region F1 and each of the rigid regions R1 and R2. As a result, the main body 11 may be curved and broken at the border between the flexible region F1 and each of the rigid regions R1 and R2.

In contrast, the circuit substrate 10a includes the semi-rigid regions SR1 and SR2 between the rigid regions R1 and R2 and the flexible region F1. Therefore, the hardness of the main body 11 varies in stages at the border between the flexible region F1 and each of the rigid regions R1 and R2. Therefore, if the line section 16 (flexible region F1) is bent, stress is distributed to the semi-rigid regions SR1 and SR2. As a result, the occurrence of breakage in the main body 11 at the border between the flexible region F1 and each of the rigid regions R1 and R2 can be reduced.

Figure 6:
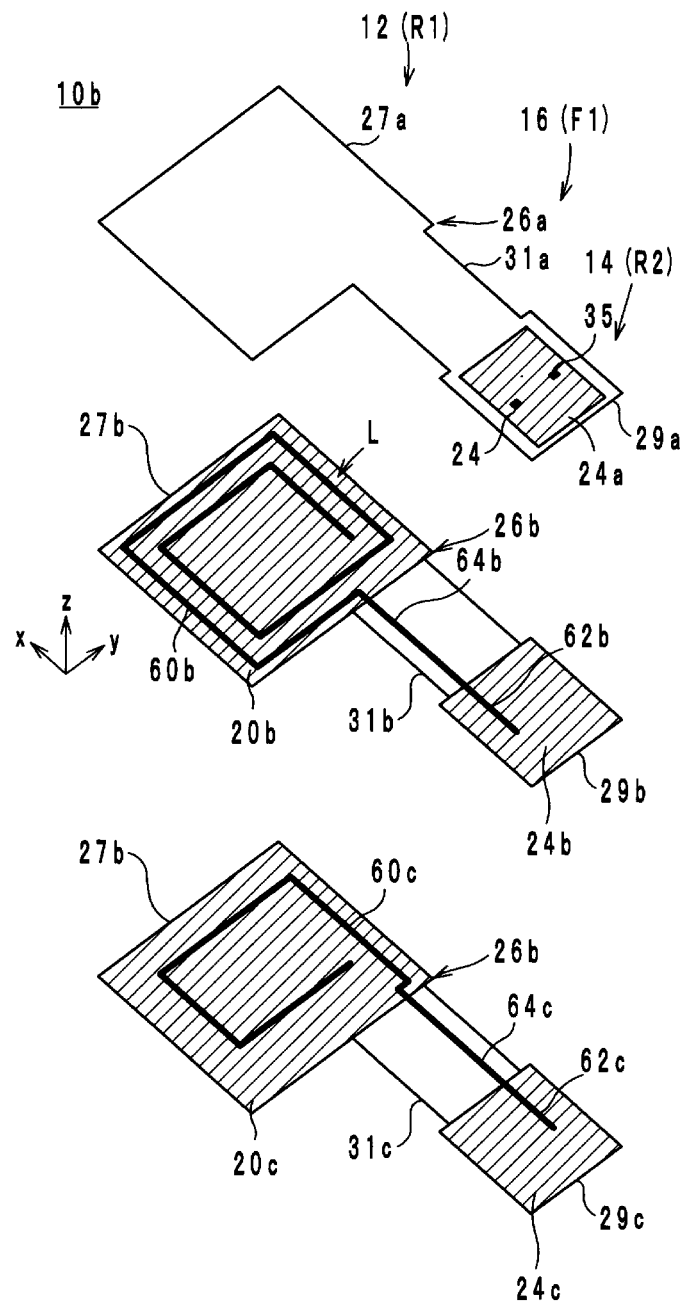
FIG. 6 is an exploded perspective view of a circuit substrate according to a second variation of a preferred embodiment of the present invention.

A circuit substrate 10b according to a second variation of a preferred embodiment of the present invention is described below with reference to the drawing. FIG. 6 is an exploded perspective view of the circuit substrate 10b according to the second variation.

In the circuit substrate 10b, a coil L is incorporated in the substrate section 12 (rigid region R1). The coil L includes spiral coil conductors 60b and 60c. Both ends of the coil L are connected to signal lines 64b and 64c. The signal lines 64b and 64c extend in the line section 16 along the x-axis direction. The signal lines 64b and 64c are connected to wiring conductors 62b and 62c electrically coupled to the lands 35. The circuit substrate 10b functions as a transmit/receive circuit for high-frequency signals by using the coil L as an antenna.

In the above-described circuit substrate 10b, if the substrate section 12, in which the coil L is disposed, is easily deformed, the inductance value of the coil L changes and the frequency characteristic of the coil L changes. Accordingly, the circuit substrate 10b can reduce changes in the frequency characteristic of the coil L by providing the substrate section 12 with the reinforcing insulative films 20b and 20c and thereby making the substrate section 12 be the rigid region R1, which is not easily deformable.

Figure 7:
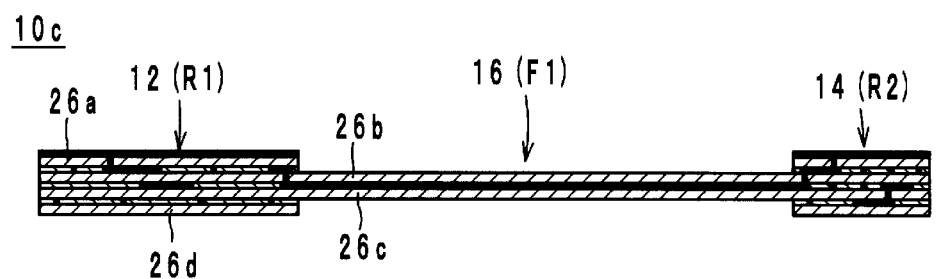
FIG. 7 is a cross-sectional configuration view of a circuit substrate according to a third variation of a preferred embodiment of the present invention.

A circuit substrate 10c according to a third variation of a preferred embodiment of the present invention is described below with reference to the drawing. FIG. 7 is a cross-sectional configuration view of the circuit substrate 10c according to the third variation.

In the circuit substrates 10, 10a, and 10b, the flexible sheets 26 have the same shape when seen in plan view from the z-axis direction. That is, for the circuit substrates 10, 10a, and 10b, the number of the flexible sheets 26 is the same at any location.

In contrast, for the circuit substrate 10c, the number of the flexible sheets 26 in the flexible region F1 is smaller than the number of the flexible sheets 26 in the rigid regions R1 and R2. Thus, the thickness in the flexible region F1 is smaller and the flexible region F1 is softer.

In manufacturing the circuit substrate 10c, after the flexible sheets 26a to 26d are press-bonded, the flexible sheets 26a and 26d in the flexible region F1 may be removed. Alternatively, the flexible sheets 26a and 26d from which the portion in the flexible region F1 has been removed may be press-bonded.

In the circuit substrates 10 and 10a to 10c, each of the rigid regions R1 and R2 indicates a region where electronic components, such as the chip components 50, are implemented, a region where the coil L is disposed, and similar regions. The flexible region F1 indicates a region where, even if it is deformed, circuit characteristics are not easily changed and where the signal lines 42c, 43c, and 44c and other elements are disposed.

As described above, preferred embodiments of the present invention are useful in a circuit substrate and a method of manufacturing the same. In particular, it is advantageous in that a circuit substrate that has circuit characteristics in which the occurrence of deviations can be reduced and that includes a relatively hard region and a relatively soft region is obtainable.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A circuit substrate comprising:
a main body including a stack of a plurality of first insulator layers made of a flexible material, the main body including a rigid region and a flexible region, the flexible region being more easily deformable than the rigid region;
a conductive layer disposed in the main body and defining circuitry; and
a second insulator layer disposed so as to cover at least a portion of an area in which the conductive layer is not disposed in the rigid region on at least one of the plurality of first insulator layers when viewed in plan from a stacking direction in which the plurality of first insulator layers are stacked; wherein
the second insulator layer is disposed in the main body; and
the second insulator layer has a thickness equal to or less than a thickness of the conductive layer in the stacking direction.

2. The circuit substrate according to claim 1, wherein the second insulator layer is made of a material that is harder than a material of the plurality of first insulator layers.

3. The circuit substrate according to claim 1, wherein the conductive layer extends across a border between the rigid region and the flexible region.

4. The circuit substrate according to claim 1, wherein the main body further includes a semi-rigid region disposed between the rigid region and the flexible region;
the rigid region is less easily deformable than the semi-rigid region;
the flexible region is more easily deformable than the semi-rigid region; and
the second insulator layer is disposed so as to cover a portion in which the conductive layer is not disposed in the semi-rigid region on at least one of the first insulator layers when seen in plan view from the stacking direction.

5. The circuit substrate according to claim 1, wherein the plurality of first insulator layers are made of thermoplastic resin, and the second insulator layer is made of thermosetting resin that is harder than a material of the plurality of first insulator layers.

6. The circuit substrate according to claim 2, wherein the second insulator layer is disposed only in the rigid region.

7. A method of manufacturing a circuit substrate according to claim 1, the method comprising:
a step of preparing the plurality of first insulator layers on which circuitry defined by the conductive layer is formed, the plurality of first insulator layers being made of the flexible material;
a step of forming the second insulator layer so as to cover at least the portion of the area in which the conductive layer is not disposed on the at least one of the plurality of first insulator layers when viewed in plan from the stacking direction in which the plurality of first insulator layers are stacked; and
a step of stacking and press-bonding the plurality of first insulator layers.

* * * * *